US012124529B2

(12) United States Patent
Huber et al.

(10) Patent No.: US 12,124,529 B2
(45) Date of Patent: Oct. 22, 2024

(54) DETECTING CONTAMINATION OR FEATURE MIXING WITHIN HARVEST POLYGONS AT A VECTOR LEVEL

(71) Applicant: Climate LLC, Saint Louis, MO (US)

(72) Inventors: Markus Huber, San Francisco, CA (US); Mike Lyons, San Francisco, CA (US); Matt Garvert, San Francisco, CA (US); Fletcher Werner, San Francisco, CA (US)

(73) Assignee: CLIMATE LLC, Saint Louis, MO (US)

( * ) Notice: Subject to any disclaimer, the term of this patent is extended or adjusted under 35 U.S.C. 154(b) by 548 days.

(21) Appl. No.: 17/465,242

(22) Filed: Sep. 2, 2021

(65) Prior Publication Data

US 2022/0067121 A1 Mar. 3, 2022

Related U.S. Application Data

(60) Provisional application No. 63/073,821, filed on Sep. 2, 2020.

(51) Int. Cl.
  *G06F 17/16* (2006.01)
  *G06F 30/12* (2020.01)
  *G06Q 50/02* (2012.01)
(52) U.S. Cl.
  CPC .............. *G06F 17/16* (2013.01); *G06F 30/12* (2020.01); *G06Q 50/02* (2013.01)
(58) Field of Classification Search
  CPC ......... G06F 17/16; G06F 30/12; G06Q 50/20; G06Q 50/00
  See application file for complete search history.

(56) References Cited

U.S. PATENT DOCUMENTS

2017/0196171 A1* 7/2017 Xu ...................... A01G 7/00
2019/0205610 A1* 7/2019 Muehlfeld ................ G06T 5/50

OTHER PUBLICATIONS

Mathews AJ. Object-based spatiotemporal analysis of vine canopy vigor using an inexpensive unmanned aerial vehicle remote sensing system. Journal of Applied Remote Sensing. Jan. 1, 2014;8(1):085199-. (Year: 2014).*

* cited by examiner

*Primary Examiner* — Chuen-Meei Gan
(74) *Attorney, Agent, or Firm* — Harness, Dickey & Pierce, P.L.C.

(57) ABSTRACT

Systems and methods for determining a degree or rate of error for treatments at a field are disclosed herein. In some embodiments, a system receives first data corresponding to a first agronomic treatment at a field and second data corresponding to a second agronomic treatment at the field. The system uses the first and second data to determine differences and overlaps between characteristics of the first and second data to quantify an error rate at individual subsets of the field. Based on the quantified error rate, a number of metrics and yield data may be interpreted differently or modified to fit the result of the quantified error rate. The system uses the quantified error rate to predict the effectiveness of treatments, modify the rate of experienced yields at a field, and recommend real-time and subsequent corrective actions to take at the field.

20 Claims, 13 Drawing Sheets

Fig. 2
(a)

200 Mobile Computer Application

- 208 Seeds and Planting Instructions
- 210 Nitrogen Instructions
- 212 Weather Instructions
- 214 Field Health Instructions
- 216 Performance Instructions 206 Digital Map Book 205 Script Generation Instructions 204 Overview and Alert Instructions 202 Account, Fields, Data Ingestion, Sharing Instructions (b)

220 Cab Computer Application

- 222 Maps - Cab
- 224 Remote View
- 226 Data Collect and Transfer
- 228 Machine Alerts
- 230 Script Transfer 232 Scouting - Cab

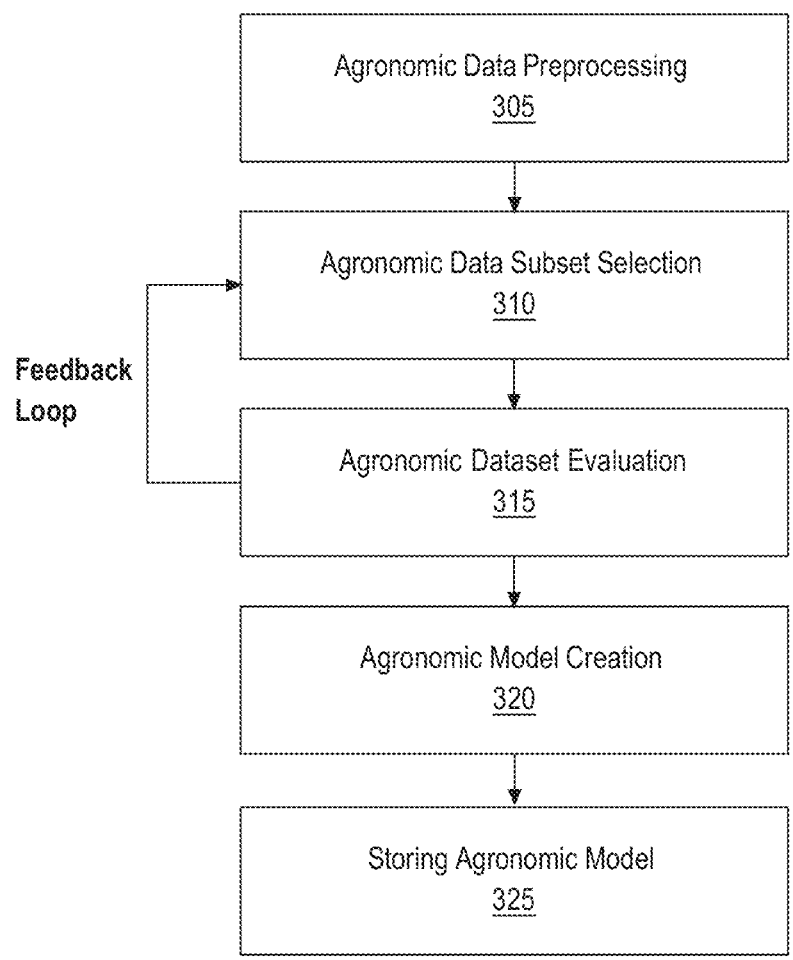

FIG. 5

Data Manager

| Nitrogen | Planting | Practices | Soil |

Planting 1(4 Fields)
Crop Corn Product
Plant Date: 2016-04-12
ILU 112 | Pop: 34000
[Edit] [Apply]

Planting 2(0 Fields)
Crop Corn Product
Plant Date: 2016-04-15
ILU 83 | Pop: 34000
[Edit] [Apply]

Planting 3(0 Fields)
Crop Corn Product
Plant Date: 2016-04-13
ILU 83 | Pop: 34000
[Edit] [Apply]

Planting 4(1 Fields)
Crop Corn Product
Plant Date: 2016-04-13
ILU 112 | Pop: 34000
[Edit] [Apply]

+ Add New Planting Plan

|  | CROP | PLANTED ACRES | PRODUCT | RELATIVE MATURITY | TARGET YIELD | POPULATION(AVG) | PLA |
|---|---|---|---|---|---|---|---|
| ☐ Select All | | | | | | | |
| ☐ Ames, IA 1 Corn \| 100 \| Boone, IA | Corn | --- | DMC82-M | 112 | 160 | 34000 | Apr |
| ☐ Austin, MN 1 Corn \| 100 \| Fredricks, MN | Corn | --- | DMC82-M | 114 | 160 | 36000 | Apr |
| ☐ Boone, IN 1 Corn \| 100 \| Boone, IA | Corn | --- | DMC82-M | 112 | 150 | 34000 | Apr |
| ☐ Champaign 1 Corn \| 100 \| Champaign, IL | Corn | --- | --- | 112 | 200 | 34000 | Apr |
| ☐ E Nebraska 1 Corn \| 100 \| Burt, NE | Corn | --- | --- | 112 | 160 | 34000 | Apr |

*FIG. 6*

DETECTING CONTAMINATION OR FEATURE MIXING WITHIN HARVEST POLYGONS AT A VECTOR LEVEL

BENEFIT CLAIM

This application claims the benefit under 35 U.S.C. § 119(e) of provisional application 63/073,821, filed Sep. 2, 2020, the entire contents of which is hereby incorporated by reference for all purposes as if fully set forth herein. The applicants hereby rescind any disclaimer of claim scope in the parent applications or the prosecution history thereof and advise the USPTO that the claims in this application may be broader than any claim in the parent applications.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright or rights whatsoever. @ 2015-2021 The Climate Corporation.

FIELD OF THE DISCLOSURE

One technical field of the present disclosure is digital computer modeling of agricultural fields and agricultural field treatments. One additional technical field is using computer-generated models to perform a shape and vector field characteristic comparison. One additional technical field is using agricultural field models to determine and correct errors specific to agricultural fields.

BACKGROUND

To be able to effectively manage agricultural fields, agrarian workers and managers would like to rely on accurate and detailed models of the fields. The models should include, for example, data indicating various treatments already applied to the fields. The models should also indicate the ideal number of resources that the workers ought to utilize to manage their fields.

Data collected before, during, and after the treatments applied to fields may be used by the workers to derive decisions pertaining to planting the seeds, watering the fields, or harvesting the crops. Indeed, the applications of the treatments to the fields at certain times may be critical to reaching the field state that is optimal for harvesting the crops.

As agricultural science and technology evolve, accurate and detailed models of fields are being developed based on, for example, a significant number of trials. Agricultural managers frequently test and revise the models before they can use them to attain an optimal field state of the field. Furthermore, the metrics relating to individual and overall yield of crops are repeatedly generated and thoroughly examined, and the information about applications of certain treatments to the fields is used to determine a course of action for cultivating the fields for years to come.

Deviations in proper applications of treatments applied to a field may cause generating data that is incorrect or misleading. That in turn, can cause generating incorrect predictions of yield over time.

Despite the precision that modern agricultural implements and machinery can provide, data collection methods are still highly susceptible to errors. Examples of common errors include the grower-induced errors or errors that occur when a human operator uses the agricultural implements incorrectly or deviates from a structured agricultural plan. The errors may cause the agricultural implements, used to gather data in a field, to report false information or perform functions that were unintentional.

Another common errors are technical errors or errors that occur when a machine element operating in a field is improperly calibrated. Examples of such errors include global positioning system (GPS) errors that occur when GPS data for an agricultural implement fails to reflect the actual position of the implement in a field. Failure to identify these errors and/or the misapplication of the error-laden data is potentially disastrous for agricultural managers. For example, an error in field measurements or maintenance may lower the estimates of the overall yield and may cause a manager to interpret the loss of yield as caused by another factor such as a treatment applied to the field. This is particularly problematic as managers may abandon otherwise effective treatments while failing to identify or correct the underlying errors.

Despite the increased sophistication and precision of agricultural data measurements, errors remain a prevalent problem in field maintenance. Modern agricultural modelling systems greatly benefit from the consideration of as many variables as possible, and the presence of errors could be problematic when planning for field operations.

Thus, there is a need for the system that utilizes measured field data to identify the presence of errors and to accurately measure impact of the errors on agricultural activities. Additionally, there is a need for the system that actively determines the presence of errors during and after field treatments and provides recommendations for the immediate and continuing corrective actions for optimizing crop yield.

SUMMARY

The appended claims may serve as a summary of the invention.

BRIEF DESCRIPTION OF THE DRAWINGS

In the drawings:

FIG. 2 illustrates two views of an example logical organization of sets of instructions in main memory when an example mobile application is loaded for execution.

FIG. 3 illustrates a programmed process by which the agricultural intelligence computer system generates one or more preconfigured agronomic models using agronomic data provided by one or more data sources.

FIG. 5 depicts an example embodiment of a timeline view for data entry.

FIG. 6 depicts an example embodiment of a spreadsheet view for data entry.

DETAILED DESCRIPTION

Figure 1:
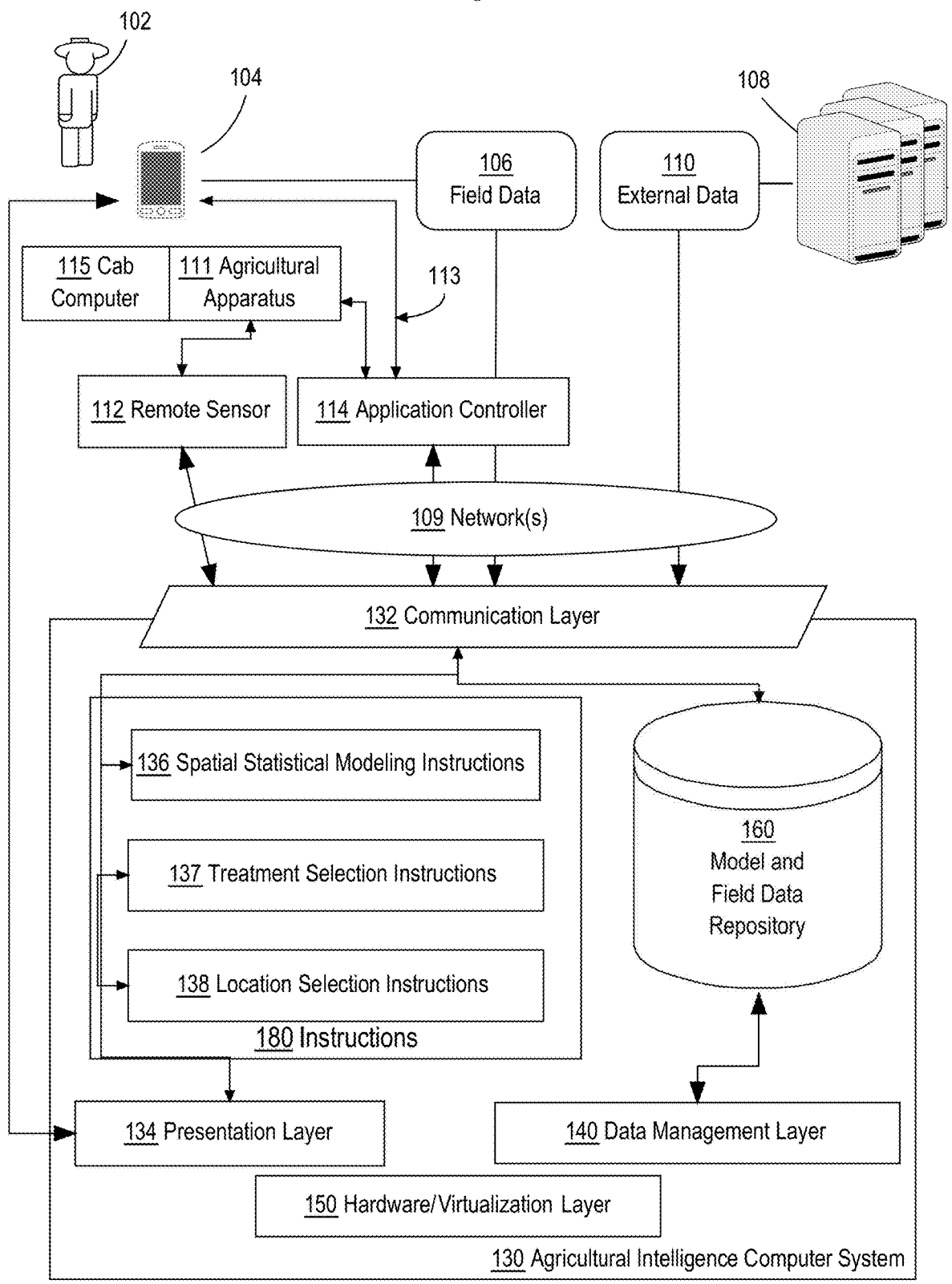
FIG. 1 illustrates an example computer system that is configured to perform the functions described herein, shown in a field environment with other apparatus with which the system may interoperate.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention. Embodiments are disclosed in sections according to the following outline:

1. GENERAL OVERVIEW
2. EXAMPLE AGRICULTURAL INTELLIGENCE COMPUTER SYSTEM
   2.1. STRUCTURAL OVERVIEW
   2.2. APPLICATION PROGRAM OVERVIEW
   2.3. DATA INGEST TO THE COMPUTER SYSTEM
   2.4. PROCESS OVERVIEW-AGRONOMIC MODEL TRAINING
   2.5. IMPLEMENTATION EXAMPLE-HARDWARE OVERVIEW
3. GENERATING A FIELD ERROR MODEL USING MEASURED FIELD DATA
   3.1. MEASUREMENT OF PLANTING DATA
   3.2. MEASUREMENT OF HARVESTING DATA
   3.3 APPLIED MODEL COMPARISON AND VECTOR ANALYSIS
   3.4. APPLICATIONS OF GENERATED ERROR MODELS
4. PRACTICAL APPLICATIONS
5. BENEFITS OF CERTAIN EMBODIMENTS
6. EXTENSIONS AND ALTERNATIVES

1. GENERAL OVERVIEW

Computer systems and computer-implemented methods for collecting and utilizing measured field data as part of a practical implementation of an error detection and quantification system in an agronomic field are described herein. According to some embodiments, an agricultural intelligence computer system collects, analyzes and/or utilizes data relating to a first treatment to a field. The first treatment to the field is represented by data received at the agricultural intelligence computer system and comprises one or more characteristics of the field which can be modelled in a position and/or vector-based format. A first treatment may comprise planting a number of seeds in a field in a specific pattern. For example, a farming implement, active in the field, may plant horizontally or vertically aligned rows of agricultural seeds, wherein every other row of seeds planted contains the same hybrid genus or species of crop.

According to some embodiments, the agricultural intelligence computer system collects and parses data relating to a second treatment to a field. The second treatment to the field is represented by data received at the agricultural intelligence computer system and comprises a pattern of traversal or treatment applied to the field by an agricultural implement. The pattern of traversal or treatment may relate to the orientation of the characteristics of the first treatment. For example, the second treatment data may represent positional data of a harvesting implement traversing the field in horizontal patterns to harvest to hybrid crops planted therein during the first treatment. The pattern of the second treatment may be further characterized by regular or periodic positions of the implement in the field. For example, patterns of traversal may be subcategorized according to position of the implement, a regular time period of operation of the implement, or the shaping of interval polygons generated during field traversal.

According to some embodiments, the agricultural intelligence computer system uses the data received from the first and second treatment to determine differences between the location and orientation of the characteristics and the pattern of traversal of the agricultural implement. The differences can be determined from the overall pattern of the traversal of the implement or may be determined on an individual geometric basis for different periods and spatial vectors of travel. For example, an agricultural implement traversing a field may be represented by a number of vector-based "polygons" corresponding to periods of traversal of the implement in the field. In various embodiments, a polygon as used in this description may be any data or representation of data which conveys some aspect of a spatial area such as a field and may correspond to a pattern, shape, work order, treatment or any other data or action performed in the spatial area. Each individual polygon may be an enclosed shape representing a portion of a treatment applied and may be compared to the first treatment data to determine a degree of overlap between the positional characteristics of the first treatment and the individual polygon.

According to some embodiments, the agricultural intelligence computer system utilizes determined "overlap" values between a traversal polygon and a field characteristic to determine a relative rate of error that occurred during the second treatment at the traversal polygon. For example, each traversal polygon relating to the second treatment may be individually or collectively analyzed to determine the overlap of field characteristics in the set of traversal polygons to determine a rate of error when applying the second treatment. According to some embodiments, the agricultural intelligence computer system utilizes determined rates of error to determine a total measured error result of a treatment applied to a field or a total expected error result of a future treatment applied to a field.

2. EXAMPLE AGRICULTURAL INTELLIGENCE COMPUTER SYSTEM

2.1 Structural Overview

FIG. 1 illustrates an example computer system that is configured to perform the functions described herein, shown in a field environment with other apparatus with which the system may interoperate. In one embodiment, a user 102 owns, operates, or possesses a field manager computing device 104 in a field location or associated with a field location such as a field intended for agricultural activities or a management location for one or more agricultural fields. The field manager computer device 104 is programmed or configured to provide field data 106 to an agricultural intelligence computer system 130 via one or more networks 109.

Examples of field data 106 include (a) identification data (for example, acreage, field name, field identifiers, geographic identifiers, boundary identifiers, crop identifiers, and any other suitable data that may be used to identify farm land, such as a common land unit (CLU), lot and block number, a parcel number, geographic coordinates and boundaries, Farm Serial Number (FSN), farm number, tract number, field number, section, township, and/or range), (b) harvest data (for example, crop type, crop variety, crop rotation, whether the crop is grown organically, harvest date, Actual Production History (APH), expected yield, yield, crop price, crop revenue, grain moisture, tillage practice, and previous growing season information), (c) soil data (for example, type, composition, pH, organic matter (OM), cation exchange capacity (CEC)), (d) planting data (for example, planting date, seed(s) type, relative maturity (RM) of planted seed(s), seed population), (e) fertilizer data (for example, nutrient type (Nitrogen, Phosphorous, Potassium), application type, application date, amount, source, method), (f) chemical application data (for example, pesticide, herbicide, fungicide, other substance or mixture of substances intended for use as a plant regulator, defoliant, or desiccant, application date, amount, source, method), (g) irrigation data (for example, application date, amount, source, method), (h) weather data (for example, precipitation, rainfall rate, predicted rainfall, water runoff rate region, temperature, wind, forecast, pressure, visibility, clouds, heat index, dew point, humidity, snow depth, air quality, sunrise, sunset), (i) imagery data (for example, imagery and light spectrum information from an agricultural apparatus sensor, camera, computer, smartphone, tablet, unmanned aerial vehicle, planes or satellite), (j) scouting observations (photos, videos, free form notes, voice recordings, voice transcriptions, weather conditions (temperature, precipitation (current and over time), soil moisture, crop growth stage, wind velocity, relative humidity, dew point, black layer)), and (k) soil, seed, crop phenology, pest and disease reporting, and predictions sources and databases.

A data server computer 108 is communicatively coupled to agricultural intelligence computer system 130 and is programmed or configured to send external data 110 to agricultural intelligence computer system 130 via the network(s) 109. The external data server computer 108 may be owned or operated by the same legal person or entity as the agricultural intelligence computer system 130, or by a different person or entity such as a government agency, non-governmental organization (NGO), and/or a private data service provider. Examples of external data include weather data, imagery data, soil data, or statistical data relating to crop yields, among others. External data 110 may consist of the same type of information as field data 106. In some embodiments, the external data 110 is provided by an external data server 108 owned by the same entity that owns and/or operates the agricultural intelligence computer system 130. For example, the agricultural intelligence computer system 130 may include a data server focused exclusively on a type of data that might otherwise be obtained from third party sources, such as weather data. In some embodiments, an external data server 108 may actually be incorporated within the system 130.

An agricultural apparatus 111 may have one or more remote sensors 112 fixed thereon, which sensors are communicatively coupled either directly or indirectly via agricultural apparatus 111 to the agricultural intelligence computer system 130 and are programmed or configured to send sensor data to agricultural intelligence computer system 130. Examples of agricultural apparatus 111 include tractors, combines, harvesters, planters, trucks, fertilizer equipment, aerial vehicles including unmanned aerial vehicles, and any other item of physical machinery or hardware, typically mobile machinery, and which may be used in tasks associated with agriculture. In some embodiments, a single unit of apparatus 111 may comprise a plurality of sensors 112 that are coupled locally in a network on the apparatus; controller area network (CAN) is example of such a network that can be installed in combines, harvesters, sprayers, and cultivators. Application controller 114 is communicatively coupled to agricultural intelligence computer system 130 via the network(s) 109 and is programmed or configured to receive one or more scripts that are used to control an operating parameter of an agricultural vehicle or implement from the agricultural intelligence computer system 130. For instance, a controller area network (CAN) bus interface may be used to enable communications from the agricultural intelligence computer system 130 to the agricultural apparatus 111, such as how the CLIMATE FIELDVIEW DRIVE, available from The Climate Corporation, San Francisco, California, is used. Sensor data may consist of the same type of information as field data 106. In some embodiments, remote sensors 112 may not be fixed to an agricultural apparatus 111 but may be remotely located in the field and may communicate with network 109.

The apparatus 111 may comprise a cab computer 115 that is programmed with a cab application, which may comprise a version or variant of the mobile application for device 104 that is further described in other sections herein. In some embodiments, cab computer 115 comprises a compact computer, often a tablet-sized computer or smartphone, with a graphical screen display, such as a color display, that is mounted within an operator's cab of the apparatus 111. Cab computer 115 may implement some or all of the operations and functions that are described further herein for the mobile computer device 104.

The network(s) 109 broadly represents any combination of one or more data communication networks including local area networks, wide area networks, internetworks, or internets, using any of wireline or wireless links, including terrestrial or satellite links. The network(s) may be implemented by any medium or mechanism that provides for the exchange of data between the various elements of FIG. 1. The various elements of FIG. 1 may also have direct (wired or wireless) communications links. The sensors 112, controller 114, external data server computer 108, and other elements of the system each comprise an interface compatible with the network(s) 109 and are programmed or configured to use standardized protocols for communication across the networks such as TCP/IP, Bluetooth, CAN protocol and higher-layer protocols such as HTTP, TLS, and the like.

Agricultural intelligence computer system 130 is programmed or configured to receive field data 106 from field manager computing device 104, external data 110 from external data server computer 108, and sensor data from remote sensor 112. Agricultural intelligence computer system 130 may be further configured to host, use or execute one or more computer programs, other software elements, digitally programmed logic such as FPGAs or ASICs, or any combination thereof to perform translation and storage of data values, construction of digital models of one or more crops on one or more fields, generation of recommendations and notifications, and generation and sending of scripts to application controller 114, in the manner described further in other sections of this disclosure.

In some embodiments, agricultural intelligence computer system 130 is programmed with or comprises a communication layer 132, presentation layer 134, data management layer 140, hardware/virtualization layer 150, and model and field data repository 160. "Layer," in this context, refers to any combination of electronic digital interface circuits, microcontrollers, firmware such as drivers, and/or computer programs or other software elements.

Communication layer 132 may be programmed or configured to perform input/output interfacing functions including sending requests to field manager computing device 104, external data server computer 108, and remote sensor 112 for field data, external data, and sensor data respectively. Communication layer 132 may be programmed or configured to send the received data to model and field data repository 160 to be stored as field data 106.

In some embodiments, agricultural intelligence computer system 130 is programmed with or comprises code instructions 180. Code instructions 180 may include one or more set of programing code instructions. For example, code instructions 180 may include spatial statistical modeling instructions 136 which, when executed by one or more processors, cause the processors to perform receiving, over a computer network, electronic digital data and using the data to generate data models. Code instructions 180 may also include treatment selection instructions 137 which, when executed, cause selecting treatments for the fields. Furthermore, code instructions 180 may include location selection instructions 138 which, when executed by the processors, cause selection of locations within the fields.

Presentation layer 134 may be programmed or configured to generate a graphical user interface (GUI) to be displayed on field manager computing device 104, cab computer 115 or other computers that are coupled to the system 130 through the network 109. The GUI may comprise controls for inputting data to be sent to agricultural intelligence computer system 130, generating requests for models and/or recommendations, and/or displaying recommendations, notifications, models, and other field data.

Data management layer 140 may be programmed or configured to manage read operations and write operations involving the repository 160 and other functional elements of the system, including queries and result sets communicated between the functional elements of the system and the repository. Examples of data management layer 140 include JDBC, SQL server interface code, and/or HADOOP interface code, among others. Repository 160 may comprise a database. As used herein, the term "database" may refer to either a body of data, a relational database management system (RDBMS), or to both. As used herein, a database may comprise any collection of data including hierarchical databases, relational databases, flat file databases, object-relational databases, object-oriented databases, distributed databases, and any other structured collection of records or data that is stored in a computer system. Examples of RDBMSs include, but are not limited to ORACLE®, MYSQL, IBM® DB2, MICROSOFT® SQL SERVER, SYBASE®, and POSTGRESQL databases. However, any database may be used that enables the systems and methods described herein.

When field data 106 is not provided directly to the agricultural intelligence computer system via one or more agricultural machines or agricultural machine devices that interacts with the agricultural intelligence computer system, the user may be prompted via one or more user interfaces on the user device (served by the agricultural intelligence computer system) to input such information. In an example embodiment, the user may specify identification data by accessing a map on the user device (served by the agricultural intelligence computer system) and selecting specific CLUs that have been graphically shown on the map. In an alternative embodiment, the user 102 may specify identification data by accessing a map on the user device (served by the agricultural intelligence computer system 130) and drawing boundaries of the field over the map. Such CLU selection or map drawings represent geographic identifiers. In alternative embodiments, the user may specify identification data by accessing field identification data (provided as shape files or in a similar format) from the U. S. Department of Agriculture Farm Service Agency or other source via the user device and providing such field identification data to the agricultural intelligence computer system.

In an example embodiment, the agricultural intelligence computer system 130 is programmed to generate and cause displaying a graphical user interface comprising a data manager for data input. After one or more fields have been identified using the methods described above, the data manager may provide one or more graphical user interface widgets which when selected can identify changes to the field, soil, crops, tillage, or nutrient practices. The data manager may include a timeline view, a spreadsheet view, and/or one or more editable programs.

Figure 5:
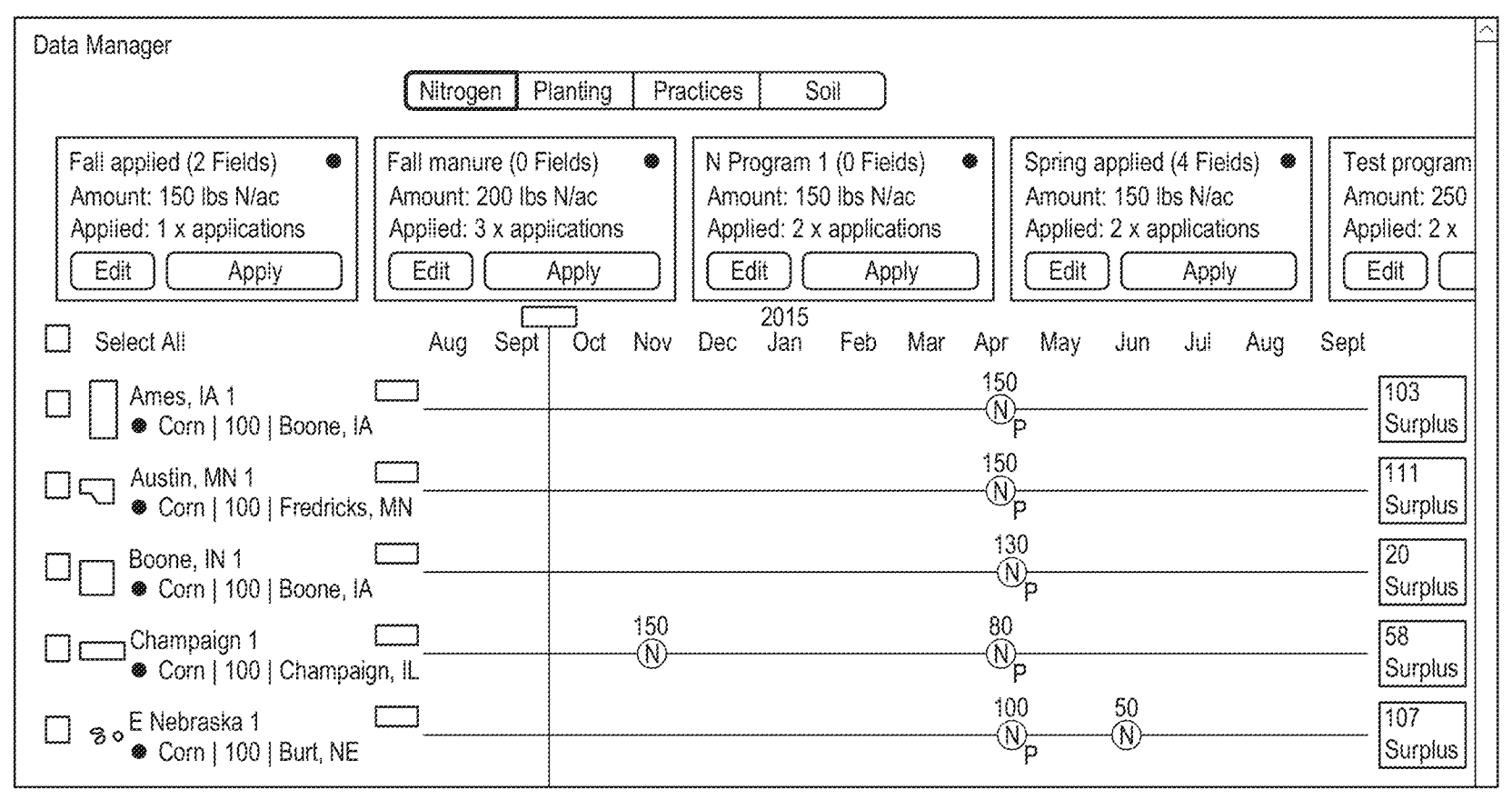

FIG. 5 depicts an example embodiment of a timeline view for data entry. Using the display depicted in FIG. 5, a user computer can input a selection of a particular field and a particular date for the addition of an event. Events depicted at the top of the timeline may include Nitrogen, Planting, Practices, and Soil. To add a nitrogen application event, a user computer may provide input to select the nitrogen tab. The user computer may then select a location on the timeline for a particular field in order to indicate an application of nitrogen on the selected field. In response to receiving a selection of a location on the timeline for a particular field, the data manager may display a data entry overlay, allowing the user computer to input data pertaining to nitrogen applications, planting procedures, soil application, tillage procedures, irrigation practices, or other information relating to the particular field. For example, if a user computer selects a portion of the timeline and indicates an application of nitrogen, then the data entry overlay may include fields for inputting an amount of nitrogen applied, a date of application, a type of fertilizer used, and any other information related to the application of nitrogen.

In some embodiments, the data manager provides an interface for creating one or more programs. "Program," in this context, refers to a set of data pertaining to nitrogen applications, planting procedures, soil application, tillage procedures, irrigation practices, or other information that may be related to one or more fields, and that can be stored in digital data storage for reuse as a set in other operations. After a program has been created, it may be conceptually applied to one or more fields and references to the program may be stored in digital storage in association with data identifying the fields. Thus, instead of manually entering identical data relating to the same nitrogen applications for multiple different fields, a user computer may create a program that indicates a particular application of nitrogen and then apply the program to multiple different fields. For example, in the timeline view of FIG. 5, the top two timelines have the "Spring applied" program selected, which includes an application of 150 lbs. N/ac in early April. The data manager may provide an interface for editing a program. In some embodiments, when a particular program is edited, each field that has selected the particular program is edited. For example, in FIG. 5, if the "Spring applied" program is edited to reduce the application of nitrogen to 130 lbs. N/ac, the top two fields may be updated with a reduced application of nitrogen based on the edited program.

In some embodiments, in response to receiving edits to a field that has a program selected, the data manager removes the correspondence of the field to the selected program. For example, if a nitrogen application is added to the top field in FIG. 5, the interface may update to indicate that the "Spring applied" program is no longer being applied to the top field. While the nitrogen application in early April may remain, updates to the "Spring applied" program would not alter the April application of nitrogen.

FIG. 6 depicts an example embodiment of a spreadsheet view for data entry. Using the display depicted in FIG. 6, a user can create and edit information for one or more fields. The data manager may include spreadsheets for inputting information with respect to Nitrogen, Planting, Practices, and Soil as depicted in FIG. 6. To edit a particular entry, a user computer may select the particular entry in the spreadsheet and update the values. For example, FIG. 6 depicts an in-progress update to a target yield value for the second field. Additionally, a user computer may select one or more fields in order to apply one or more programs. In response to receiving a selection of a program for a particular field, the data manager may automatically complete the entries for the particular field based on the selected program. As with the timeline view, the data manager may update the entries for each field associated with a particular program in response to receiving an update to the program. Additionally, the data manager may remove the correspondence of the selected program to the field in response to receiving an edit to one of the entries for the field.

In some embodiments, model and field data is stored in model and field data repository 160. Model data comprises data models created for one or more fields. For example, a crop model may include a digitally constructed model of the development of a crop on one or more fields. "Model," in this context, refers to an electronic digitally stored set of executable instructions and data values, associated with one another, which are capable of receiving and responding to a programmatic or other digital call, invocation, or request for resolution based upon specified input values, to yield one or more stored or calculated output values that can serve as the basis of computer-implemented recommendations, output data displays, or machine control, among other things. Persons of skill in the field find it convenient to express models using mathematical equations, but that form of expression does not confine the models disclosed herein to abstract concepts; instead, each model herein has a practical application in a computer in the form of stored executable instructions and data that implement the model using the computer. The model may include a model of past events on the one or more fields, a model of the current status of the one or more fields, and/or a model of predicted events on the one or more fields. Model and field data may be stored in data structures in memory, rows in a database table, in flat files or spreadsheets, or other forms of stored digital data.

In some embodiments, each of spatial statistical modeling instruction 136, treatment selection instructions 137, and location selection instructions 138 comprises a set of one or more pages of main memory, such as RAM, in the agricultural intelligence computer system 130 into which executable instructions have been loaded and which when executed cause the agricultural intelligence computer system to perform the functions or operations that are described herein with reference to those modules. For example, spatial statistical modeling instruction 136 may comprise a set of pages in RAM that contain instructions which when executed cause spatial statistical modeling functions that are described herein. The instructions may be in machine executable code in the instruction set of a CPU and may have been compiled based upon source code written in JAVA, C, C++, OBJECTIVE-C, or any other human-readable programming language or environment, alone or in combination with scripts in JAVASCRIPT, other scripting languages and other programming source text. The term "pages" is intended to refer broadly to any region within main memory and the specific terminology used in a system may vary depending on the memory architecture or processor architecture. In another embodiment, each of spatial statistical modeling instruction 136 also may represent one or more files or projects of source code that are digitally stored in a mass storage device such as non-volatile RAM or disk storage, in the agricultural intelligence computer system 130 or a separate repository system, which when compiled or interpreted cause generating executable instructions which when executed cause the agricultural intelligence computer system to perform the functions or operations that are described herein with reference to those modules. In other words, the drawing figure may represent the manner in which programmers or software developers organize and arrange source code for later compilation into an executable, or interpretation into bytecode or the equivalent, for execution by the agricultural intelligence computer system 130.

Spatial statistical modeling instruction 136 comprise a set of computer readable instructions which, when executed by one or more processors, cause the agricultural intelligence computer system to generate a spatial statistical model of yield for use in generating control data for an agronomic trial and/or for use in identifying locations for implementing a trial. Treatment selection instructions 137 comprise a set of computer readable instructions which, when executed by one or more processors, cause the agricultural intelligence computer system to select a particular treatment based on a spatial statistical model of yield and yield data for one or more testing locations on a field which received a different treatment as the rest of the agronomic field. Location selection instructions 138 comprise a set of computer readable instructions which, when executed by one or more processors, cause the agricultural intelligence computer system to select locations for implementing a trial based on a spatial statistical model of yield and yield data for the agronomic field.

Figure 4:
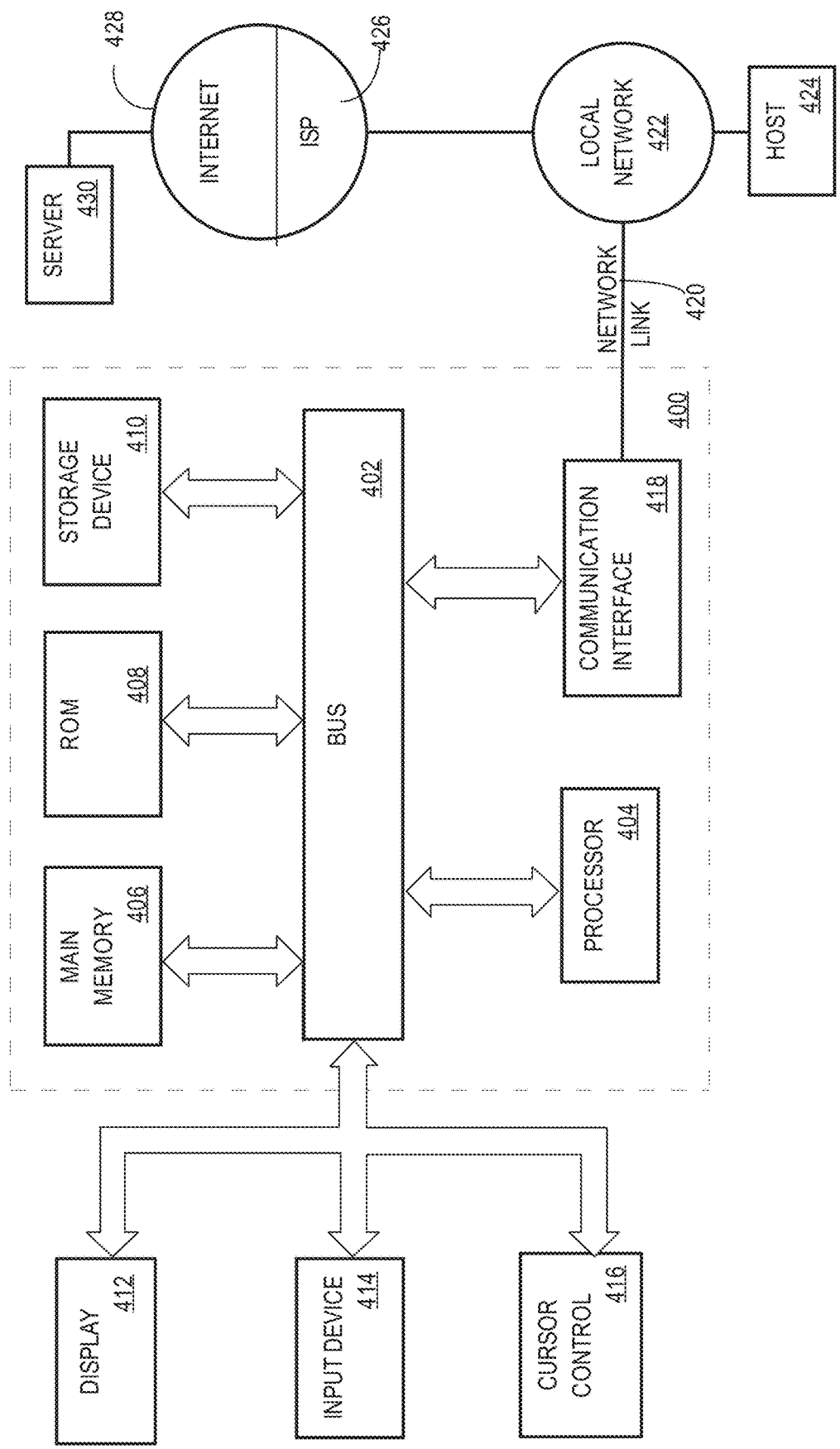
FIG. 4 is a block diagram that illustrates a computer system upon which some embodiments of the invention may be implemented.

Hardware/virtualization layer 150 comprises one or more central processing units (CPUs), memory controllers, and other devices, components, or elements of a computer system such as volatile or non-volatile memory, non-volatile storage such as disk, and I/O devices or interfaces as illustrated and described, for example, in connection with FIG. 4. The layer 150 also may comprise programmed instructions that are configured to support virtualization, containerization, or other technologies.

For purposes of illustrating a clear example, FIG. 1 shows a limited number of instances of certain functional elements. However, in other embodiments, there may be any number of such elements. For example, embodiments may use thousands or millions of different mobile computing devices 104 associated with different users. Further, the system 130 and/or external data server computer 108 may be implemented using two or more processors, cores, clusters, or instances of physical machines or virtual machines, configured in a discrete location or co-located with other elements in a datacenter, shared computing facility or cloud computing facility.

2.2. Application Program Overview

In some embodiments, the implementation of the functions described herein using one or more computer programs or other software elements that are loaded into and executed using one or more general-purpose computers will cause the general-purpose computers to be configured as a particular machine or as a computer that is specially adapted to perform the functions described herein. Further, each of the flow diagrams that are described further herein may serve, alone or in combination with the descriptions of processes and functions in prose herein, as algorithms, plans or directions that may be used to program a computer or logic to implement the functions that are described. In other words, all the prose text herein, and all the drawing figures, together are intended to provide disclosure of algorithms, plans or directions that are sufficient to permit a skilled person to program a computer to perform the functions that are described herein, in combination with the skill and knowledge of such a person given the level of skill that is appropriate for inventions and disclosures of this type.

In some embodiments, user 102 interacts with agricultural intelligence computer system 130 using field manager computing device 104 configured with an operating system and one or more application programs or apps; the field manager computing device 104 also may interoperate with the agricultural intelligence computer system independently and automatically under program control or logical control and direct user interaction is not always required. Field manager computing device 104 broadly represents one or more of a smartphone, PDA, tablet computing device, laptop computer, desktop computer, workstation, or any other computing device capable of transmitting and receiving information and performing the functions described herein. Field manager computing device 104 may communicate via a network using a mobile application stored on field manager computing device 104, and in some embodiments, the device may be coupled using a cable 113 or connector to the sensor 112 and/or controller 114. A particular user 102 may own, operate or possess and use, in connection with system 130, more than one field manager computing device 104 at a time.

The mobile application may provide client-side functionality, via the network to one or more mobile computing devices. In an example embodiment, field manager computing device 104 may access the mobile application via a web browser or a local client application or app. Field manager computing device 104 may transmit data to, and receive data from, one or more front-end servers, using web-based protocols or formats such as HTTP, XML and/or JSON, or app-specific protocols. In an example embodiment, the data may take the form of requests and user information input, such as field data, into the mobile computing device. In some embodiments, the mobile application interacts with location tracking hardware and software on field manager computing device 104 which determines the location of field manager computing device 104 using standard tracking techniques such as multilateration of radio signals, the global positioning system (GPS), Wi-Fi positioning systems, or other methods of mobile positioning. In some cases, location data or other data associated with the device 104, user 102, and/or user account(s) may be obtained by queries to an operating system of the device or by requesting an app on the device to obtain data from the operating system.

In some embodiments, field manager computing device 104 sends field data 106 to agricultural intelligence computer system 130 comprising or including, but not limited to, data values representing one or more of: a geographical location of the one or more fields, tillage information for the one or more fields, crops planted in the one or more fields, and soil data extracted from the one or more fields. Field manager computing device 104 may send field data 106 in response to user input from user 102 specifying the data values for the one or more fields. Additionally, field manager computing device 104 may automatically send field data 106 when one or more of the data values becomes available to field manager computing device 104. For example, field manager computing device 104 may be communicatively coupled to remote sensor 112 and/or application controller 114 which include an irrigation sensor and/or irrigation controller. In response to receiving data indicating that application controller 114 released water onto the one or more fields, field manager computing device 104 may send field data 106 to agricultural intelligence computer system 130 indicating that water was released on the one or more fields. Field data 106 identified in this disclosure may be input and communicated using electronic digital data that is communicated between computing devices using parameterized URLs over HTTP, or another suitable communication or messaging protocol.

A commercial example of the mobile application is CLIMATE FIELDVIEW, commercially available from The Climate Corporation, San Francisco, California. The CLIMATE FIELDVIEW application, or other applications, may be modified, extended, or adapted to include features, functions, and programming that have not been disclosed earlier than the filing date of this disclosure. In one embodiment, the mobile application comprises an integrated software platform that allows a grower to make fact-based decisions for their operation because it combines historical data about the grower's fields with any other data that the grower wishes to compare. The combinations and comparisons may be performed in real time and are based upon scientific models that provide potential scenarios to permit the grower to make better, more informed decisions.

FIG. 2 illustrates two views of an example logical organization of sets of instructions in main memory when an example mobile application is loaded for execution. In FIG. 2, each named element represents a region of one or more pages of RAM or other main memory, or one or more blocks of disk storage or other non-volatile storage, and the programmed instructions within those regions. In one embodiment, in view (a), a mobile computer application 200 comprises account-fields-data ingestion-sharing instructions 202, overview and alert instructions 204, digital map book instructions 206, seeds and planting instructions 208, nitrogen instructions 210, weather instructions 212, field health instructions 214, and performance instructions 216.

In one embodiment, a mobile computer application 200 comprises account, fields, data ingestion, sharing instructions 202 which are programmed to receive, translate, and ingest field data from third party systems via manual upload or APIs. Data types may include field boundaries, yield maps, as-planted maps, soil test results, as-applied maps, and/or management zones, among others. Data formats may include shape files, native data formats of third parties, and/or farm management information system (FMIS) exports, among others. Receiving data may occur via manual upload, e-mail with attachment, external APIs that push data to the mobile application, or instructions that call APIs of external systems to pull data into the mobile application. In one embodiment, mobile computer application 200 comprises a data inbox. In response to receiving a selection of the data inbox, the mobile computer application 200 may display a graphical user interface for manually uploading data files and importing uploaded files to a data manager.

In one embodiment, digital map book instructions 206 comprise field map data layers stored in device memory and are programmed with data visualization tools and geospatial field notes. This provides growers with convenient information close at hand for reference, logging and visual insights into field performance. In one embodiment, overview and alert instructions 204 are programmed to provide an operation-wide view of what is important to the grower, and timely recommendations to take action or focus on particular issues. This permits the grower to focus time on what needs attention, to save time and preserve yield throughout the season. In one embodiment, seeds and planting instructions 208 are programmed to provide tools for seed selection, hybrid placement, and script creation, including variable rate (VR) script creation, based upon scientific models and empirical data. This enables growers to maximize yield or return on investment through optimized seed purchase, placement, and population.

In one embodiment, script generation instructions 205 are programmed to provide an interface for generating scripts, including variable rate (VR) fertility scripts. The interface enables growers to create scripts for field implements, such as nutrient applications, planting, and irrigation. For example, a planting script interface may comprise tools for identifying a type of seed for planting. Upon receiving a selection of the seed type, mobile computer application 200 may display one or more fields broken into management zones, such as the field map data layers created as part of digital map book instructions 206. In one embodiment, the management zones comprise soil zones along with a panel identifying each soil zone and a soil name, texture, drainage for each zone, or other field data. Mobile computer application 200 may also display tools for editing or creating such, such as graphical tools for drawing management zones, such as soil zones, over a map of one or more fields. Planting procedures may be applied to all management zones or different planting procedures may be applied to different subsets of management zones. When a script is created, mobile computer application 200 may make the script available for download in a format readable by an application controller, such as an archived or compressed format. Additionally, and/or alternatively, a script may be sent directly to cab computer 115 from mobile computer application 200 and/or uploaded to one or more data servers and stored for further use.

In one embodiment, nitrogen instructions 210 are programmed to provide tools to inform nitrogen decisions by visualizing the availability of nitrogen to crops. This enables growers to maximize yield or return on investment through optimized nitrogen application during the season. Example programmed functions include displaying images such as SSURGO images to enable drawing of fertilizer application zones and/or images generated from subfield soil data, such as data obtained from sensors, at a high spatial resolution (as fine as millimeters or smaller depending on sensor proximity and resolution); upload of existing grower-defined zones; providing a graph of plant nutrient availability and/or a map to enable tuning application(s) of nitrogen across multiple zones; output of scripts to drive machinery; tools for mass data entry and adjustment; and/or maps for data visualization, among others. "Mass data entry," in this context, may mean entering data once and then applying the same data to multiple fields and/or zones that have been defined in the system; example data may include nitrogen application data that is the same for many fields and/or zones of the same grower, but such mass data entry applies to the entry of any type of field data into the mobile computer application 200. For example, nitrogen instructions 210 may be programmed to accept definitions of nitrogen application and practice programs and to accept user input specifying to apply those programs across multiple fields. "Nitrogen application programs," in this context, refers to stored, named sets of data that associates: a name, color code or other identifier, one or more dates of application, types of material or product for each of the dates and amounts, method of application or incorporation such as injected or broadcast, and/or amounts or rates of application for each of the dates, crop or hybrid that is the subject of the application, among others. "Nitrogen practices programs," in this context, refer to stored, named sets of data that associates: a practices name; a previous crop; a tillage system; a date of primarily tillage; one or more previous tillage systems that were used; one or more indicators of application type, such as manure, that were used. Nitrogen instructions 210 also may be programmed to generate and cause displaying a nitrogen graph, which indicates projections of plant use of the specified nitrogen and whether a surplus or shortfall is predicted; in some embodiments, different color indicators may signal a magnitude of surplus or magnitude of shortfall. In one embodiment, a nitrogen graph comprises a graphical display in a computer display device comprising a plurality of rows, each row associated with and identifying a field; data specifying what crop is planted in the field, the field size, the field location, and a graphic representation of the field perimeter; in each row, a timeline by month with graphic indicators specifying each nitrogen application and amount at points correlated to month names; and numeric and/or colored indicators of surplus or shortfall, in which color indicates magnitude.

In one embodiment, the nitrogen graph may include one or more user input features, such as dials or slider bars, to dynamically change the nitrogen planting and practices programs so that a user may optimize his nitrogen graph. The user may then use his optimized nitrogen graph and the related nitrogen planting and practices programs to implement one or more scripts, including variable rate (VR) fertility scripts. Nitrogen instructions 210 also may be programmed to generate and cause displaying a nitrogen map, which indicates projections of plant use of the specified nitrogen and whether a surplus or shortfall is predicted; in some embodiments, different color indicators may signal a magnitude of surplus or magnitude of shortfall. The nitrogen map may display projections of plant use of the specified nitrogen and whether a surplus or shortfall is predicted for different times in the past and the future (such as daily, weekly, monthly, or yearly) using numeric and/or colored indicators of surplus or shortfall, in which color indicates magnitude. In one embodiment, the nitrogen map may include one or more user input features, such as dials or slider bars, to dynamically change the nitrogen planting and practices programs so that a user may optimize his nitrogen map, such as to obtain a preferred amount of surplus to shortfall. The user may then use his optimized nitrogen map and the related nitrogen planting and practices programs to implement one or more scripts, including variable rate (VR) fertility scripts. In other embodiments, similar instructions to the nitrogen instructions 210 could be used for application of other nutrients (such as phosphorus and potassium), application of pesticide, and irrigation programs.

In one embodiment, weather instructions 212 are programmed to provide field-specific recent weather data and forecasted weather information. This enables growers to save time and have an efficient integrated display with respect to daily operational decisions.

In one embodiment, field health instructions 214 are programmed to provide timely remote sensing images highlighting in-season crop variation and potential concerns. Example programmed functions include cloud checking, to identify possible clouds or cloud shadows; determining nitrogen indices based on field images; graphical visualization of scouting layers, including, for example, those related to field health, and viewing and/or sharing of scouting notes; and/or downloading satellite images from multiple sources and prioritizing the images for the grower, among others.

In one embodiment, performance instructions 216 are programmed to provide reports, analysis, and insight tools using on-farm data for evaluation, insights, and decisions. This enables the grower to seek improved outcomes for the next year through fact-based conclusions about why return on investment was at prior levels, and insight into yield-limiting factors. The performance instructions 216 may be programmed to communicate via the network(s) 109 to back-end analytics programs executed at agricultural intelligence computer system 130 and/or external data server computer 108 and configured to analyze metrics such as yield, yield differential, hybrid, population, SSURGO zone, soil test properties, or elevation, among others. Programmed reports and analysis may include yield variability analysis, treatment effect estimation, benchmarking of yield and other metrics against other growers based on anonymized data collected from many growers, or data for seeds and planting, among others.

Applications having instructions configured in this way may be implemented for different computing device platforms while retaining the same general user interface appearance. For example, the mobile application may be programmed for execution on tablets, smartphones, or server computers that are accessed using browsers at client computers. Further, the mobile application as configured for tablet computers or smartphones may provide a full app experience or a cab app experience that is suitable for the display and processing capabilities of cab computer 115. For example, referring now to view (b) of FIG. 2, in one embodiment a cab computer application 220 may comprise maps-cab instructions 222, remote view instructions 224, data collect and transfer instructions 226, machine alerts instructions 228, script transfer instructions 230, and scouting-cab instructions 232. The code base for the instructions of view (b) may be the same as for view (a) and executables implementing the code may be programmed to detect the type of platform on which they are executing and to expose, through a graphical user interface, only those functions that are appropriate to a cab platform or full platform. This approach enables the system to recognize the distinctly different user experience that is appropriate for an in-cab environment and the different technology environment of the cab. The maps-cab instructions 222 may be programmed to provide map views of fields, farms or regions that are useful in directing machine operation. The remote view instructions 224 may be programmed to turn on, manage, and provide views of machine activity in real-time or near real-time to other computing devices connected to the system 130 via wireless networks, wired connectors or adapters, and the like. The data collect and transfer instructions 226 may be programmed to turn on, manage, and provide transfer of data collected at sensors and controllers to the system 130 via wireless networks, wired connectors or adapters, and the like. The machine alerts instructions 228 may be programmed to detect issues with operations of the machine or tools that are associated with the cab and generate operator alerts. The script transfer instructions 230 may be configured to transfer in scripts of instructions that are configured to direct machine operations or the collection of data. The scouting-cab instructions 232 may be programmed to display location-based alerts and information received from the system 130 based on the location of the field manager computing device 104, agricultural apparatus 111, or sensors 112 in the field and ingest, manage, and provide transfer of location-based scouting observations to the system 130 based on the location of the agricultural apparatus 111 or sensors 112 in the field.

2.3. Data Ingest to the Computer System

In some embodiments, external data server computer 108 stores external data 110, including soil data representing soil composition for the one or more fields and weather data representing temperature and precipitation on the one or more fields. The weather data may include past and present weather data as well as forecasts for future weather data. In some embodiments, external data server computer 108 comprises a plurality of servers hosted by different entities. For example, a first server may contain soil composition data while a second server may include weather data. Additionally, soil composition data may be stored in multiple servers. For example, one server may store data representing percentage of sand, silt, and clay in the soil while a second server may store data representing percentage of organic matter (OM) in the soil.

In some embodiments, remote sensor 112 comprises one or more sensors that are programmed or configured to produce one or more observations. Remote sensor 112 may be aerial sensors, such as satellites, vehicle sensors, planting equipment sensors, tillage sensors, fertilizer or insecticide application sensors, harvester sensors, and any other implement capable of receiving data from one or more fields. In some embodiments, application controller 114 is programmed or configured to receive instructions from agricultural intelligence computer system 130. Application controller 114 may also be programmed or configured to control an operating parameter of an agricultural vehicle or implement. For example, an application controller may be programmed or configured to control an operating parameter of a vehicle, such as a tractor, planting equipment, tillage equipment, fertilizer or insecticide equipment, harvester equipment, or other farm implements such as a water valve. Other embodiments may use any combination of sensors and controllers, of which the following are merely selected examples.

The system 130 may obtain or ingest data under user 102 control, on a mass basis from a large number of growers who have contributed data to a shared database system. This form of obtaining data may be termed "manual data ingest" as one or more user-controlled computer operations are requested or triggered to obtain data for use by the system 130. As an example, the CLIMATE FIELDVIEW application, commercially available from The Climate Corporation, San Francisco, California, may be operated to export data to system 130 for storing in the repository 160.

For example, seed monitor systems can both control planter apparatus components and obtain planting data, including signals from seed sensors via a signal harness that comprises a CAN backbone and point-to-point connections for registration and/or diagnostics. Seed monitor systems can be programmed or configured to display seed spacing, population and other information to the user via the cab computer 115 or other devices within the system 130. Examples are disclosed in U.S. Pat. No. 8,738,243 and US Pat. Pub. 20150094916, and the present disclosure assumes knowledge of those other patent disclosures.

Likewise, yield monitor systems may contain yield sensors for harvester apparatus that send yield measurement data to the cab computer 115 or other devices within the system 130. Yield monitor systems may utilize one or more remote sensors 112 to obtain grain moisture measurements in a combine or other harvester and transmit these measurements to the user via the cab computer 115 or other devices within the system 130.

In some embodiments, examples of sensors 112 that may be used with any moving vehicle or apparatus of the type described elsewhere herein include kinematic sensors and position sensors. Kinematic sensors may comprise any of speed sensors such as radar or wheel speed sensors, accelerometers, or gyros. Position sensors may comprise GPS receivers or transceivers, or Wi-Fi-based position or mapping apps that are programmed to determine location based upon nearby Wi-Fi hotspots, among others.

In some embodiments, examples of sensors 112 that may be used with tractors or other moving vehicles include engine speed sensors, fuel consumption sensors, area counters or distance counters that interact with GPS or radar signals, PTO (power take-off) speed sensors, tractor hydraulics sensors configured to detect hydraulics parameters such as pressure or flow, and/or and hydraulic pump speed, wheel speed sensors or wheel slippage sensors. In some embodiments, examples of controllers 114 that may be used with tractors include hydraulic directional controllers, pressure controllers, and/or flow controllers; hydraulic pump speed controllers; speed controllers or governors; hitch position controllers; or wheel position controllers provide automatic steering.

In some embodiments, examples of sensors 112 that may be used with seed planting equipment such as planters, drills, or air seeders include seed sensors, which may be optical, electromagnetic, or impact sensors; downforce sensors such as load pins, load cells, pressure sensors; soil property sensors such as reflectivity sensors, moisture sensors, electrical conductivity sensors, optical residue sensors, or temperature sensors; component operating criteria sensors such as planting depth sensors, downforce cylinder pressure sensors, seed disc speed sensors, seed drive motor encoders, seed conveyor system speed sensors, or vacuum level sensors; or pesticide application sensors such as optical or other electromagnetic sensors, or impact sensors. In some embodiments, examples of controllers 114 that may be used with such seed planting equipment include: toolbar fold controllers, such as controllers for valves associated with hydraulic cylinders; downforce controllers, such as controllers for valves associated with pneumatic cylinders, airbags, or hydraulic cylinders, and programmed for applying downforce to individual row units or an entire planter frame; planting depth controllers, such as linear actuators; metering controllers, such as electric seed meter drive motors, hydraulic seed meter drive motors, or swath control clutches; hybrid selection controllers, such as seed meter drive motors, or other actuators programmed for selectively allowing or preventing seed or an air-seed mixture from delivering seed to or from seed meters or central bulk hoppers; metering controllers, such as electric seed meter drive motors, or hydraulic seed meter drive motors; seed conveyor system controllers, such as controllers for a belt seed delivery conveyor motor; marker controllers, such as a controller for a pneumatic or hydraulic actuator; or pesticide application rate controllers, such as metering drive controllers, orifice size or position controllers.

In some embodiments, examples of sensors 112 that may be used with tillage equipment include position sensors for tools such as shanks or discs; tool position sensors for such tools that are configured to detect depth, gang angle, or lateral spacing; downforce sensors; or draft force sensors. In some embodiments, examples of controllers 114 that may be used with tillage equipment include downforce controllers or tool position controllers, such as controllers configured to control tool depth, gang angle, or lateral spacing.

In some embodiments, examples of sensors 112 that may be used in relation to apparatus for applying fertilizer, insecticide, fungicide and the like, such as on-planter starter fertilizer systems, subsoil fertilizer applicators, or fertilizer sprayers, include: fluid system criteria sensors, such as flow sensors or pressure sensors; sensors indicating which spray head valves or fluid line valves are open; sensors associated with tanks, such as fill level sensors; sectional or system-wide supply line sensors, or row-specific supply line sensors; or kinematic sensors such as accelerometers disposed on sprayer booms. In some embodiments, examples of controllers 114 that may be used with such apparatus include pump speed controllers; valve controllers that are programmed to control pressure, flow, direction, PWM and the like; or position actuators, such as for boom height, subsoiler depth, or boom position.

In some embodiments, examples of sensors 112 that may be used with harvesters include yield monitors, such as impact plate strain gauges or position sensors, capacitive flow sensors, load sensors, weight sensors, or torque sensors associated with elevators or augers, or optical or other electromagnetic grain height sensors; grain moisture sensors, such as capacitive sensors; grain loss sensors, including impact, optical, or capacitive sensors; header operating criteria sensors such as header height, header type, deck plate gap, feeder speed, and reel speed sensors; separator operating criteria sensors, such as concave clearance, rotor speed, shoe clearance, or chaffer clearance sensors; auger sensors for position, operation, or speed; or engine speed sensors. In some embodiments, examples of controllers 114 that may be used with harvesters include header operating criteria controllers for elements such as header height, header type, deck plate gap, feeder speed, or reel speed; separator operating criteria controllers for features such as concave clearance, rotor speed, shoe clearance, or chaffer clearance; or controllers for auger position, operation, or speed.

In some embodiments, examples of sensors 112 that may be used with grain carts include weight sensors, or sensors for auger position, operation, or speed. In some embodiments, examples of controllers 114 that may be used with grain carts include controllers for auger position, operation, or speed.

In some embodiments, examples of sensors 112 and controllers 114 may be installed in unmanned aerial vehicle (UAV) apparatus or "drones." Such sensors may include cameras with detectors effective for any range of the electromagnetic spectrum including visible light, infrared, ultraviolet, near-infrared (NIR), and the like; accelerometers; altimeters; temperature sensors; humidity sensors; pitot tube sensors or other airspeed or wind velocity sensors; battery life sensors; or radar emitters and reflected radar energy detection apparatus; other electromagnetic radiation emitters and reflected electromagnetic radiation detection apparatus. Such controllers may include guidance or motor control apparatus, control surface controllers, camera controllers, or controllers programmed to turn on, operate, obtain data from, manage, and configure any of the foregoing sensors. Examples are disclosed in U.S. Pat. No. 9,922,405 and the present disclosure assumes knowledge of that other patent disclosure.

In some embodiments, sensors 112 and controllers 114 may be affixed to soil sampling and measurement apparatus that is configured or programmed to sample soil and perform soil chemistry tests, soil moisture tests, and other tests pertaining to soil. For example, the apparatus disclosed in U.S. Pat. Nos. 8,767,194, 8,712,148 may be used, and the present disclosure assumes knowledge of those patent disclosures. In some embodiments, sensors 112 and controllers 114 may comprise weather devices for monitoring weather conditions of fields. For example, the apparatus disclosed in U.S. Pat. No. 10,768,340 may be used, and the present disclosure assumes knowledge of that patent disclosures.

2.4. Process Overview-Agronomic Model Training

In some embodiments, the agricultural intelligence computer system 130 is programmed or configured to create an agronomic model. In this context, an agronomic model is a data structure in memory of the agricultural intelligence computer system 130 that comprises field data 106, such as identification data and harvest data for one or more fields. The agronomic model may also comprise calculated agronomic properties which describe either conditions which may affect the growth of one or more crops on a field, or properties of the one or more crops, or both. Additionally, an agronomic model may comprise recommendations based on agronomic factors such as crop recommendations, irrigation recommendations, planting recommendations, fertilizer recommendations, fungicide recommendations, pesticide recommendations, harvesting recommendations and other crop management recommendations. The agronomic factors may also be used to estimate one or more crop related results, such as agronomic yield. The agronomic yield of a crop is an estimate of the quantity of the crop that is produced, or in some examples the revenue or profit obtained from the produced crop.

In some embodiments, the agricultural intelligence computer system 130 may use a preconfigured agronomic model to calculate agronomic properties related to currently received location and crop information for one or more fields. The preconfigured agronomic model is based upon previously processed field data, including but not limited to, identification data, harvest data, fertilizer data, and weather data. The preconfigured agronomic model may have been cross validated to ensure accuracy of the model. Cross validation may include comparison to ground truthing that compares predicted results with actual results on a field, such as a comparison of precipitation estimate with a rain gauge or sensor providing weather data at the same or nearby location or an estimate of nitrogen content with a soil sample measurement.

FIG. 3 illustrates a programmed process by which the agricultural intelligence computer system generates one or more preconfigured agronomic models using field data provided by one or more data sources. FIG. 3 may serve as an algorithm or instructions for programming the functional elements of the agricultural intelligence computer system 130 to perform the operations that are now described.

At block 305, the agricultural intelligence computer system 130 is configured or programmed to implement agronomic data preprocessing of field data received from one or more data sources. The field data received from one or more data sources may be preprocessed for the purpose of removing noise, distorting effects, and confounding factors within the agronomic data including measured outliers that could adversely affect received field data values. Embodiments of agronomic data preprocessing may include, but are not limited to, removing data values commonly associated with outlier data values, specific measured data points that are known to unnecessarily skew other data values, data smoothing, aggregation, or sampling techniques used to remove or reduce additive or multiplicative effects from noise, and other filtering or data derivation techniques used to provide clear distinctions between positive and negative data inputs.

At block 310, the agricultural intelligence computer system 130 is configured or programmed to perform data subset selection using the preprocessed field data in order to identify datasets useful for initial agronomic model generation. The agricultural intelligence computer system 130 may implement data subset selection techniques including, but not limited to, a genetic algorithm method, an all subset models method, a sequential search method, a stepwise regression method, a particle swarm optimization method, and an ant colony optimization method. For example, a genetic algorithm selection technique uses an adaptive heuristic search algorithm, based on evolutionary principles of natural selection and genetics, to determine and evaluate datasets within the preprocessed agronomic data.

At block 315, the agricultural intelligence computer system 130 is configured or programmed to implement field dataset evaluation. In some embodiments, a specific field dataset is evaluated by creating an agronomic model and using specific quality thresholds for the created agronomic model. Agronomic models may be compared and/or validated using one or more comparison techniques, such as, but not limited to, root mean square error with leave-one-out cross validation (RMSECV), mean absolute error, and mean percentage error. For example, RMSECV can cross validate agronomic models by comparing predicted agronomic property values created by the agronomic model against historical agronomic property values collected and analyzed. In some embodiments, the agronomic dataset evaluation logic is used as a feedback loop where agronomic datasets that do not meet configured quality thresholds are used during future data subset selection steps (block 310).

At block 320, the agricultural intelligence computer system 130 is configured or programmed to implement agronomic model creation based upon the cross validated agronomic datasets. In some embodiments, agronomic model creation may implement multivariate regression techniques to create preconfigured agronomic data models.

At block 325, the agricultural intelligence computer system 130 is configured or programmed to store the preconfigured agronomic data models for future field data evaluation.

2.5. Implementation Example-Hardware Overview

According to one embodiment, the techniques described herein are implemented by one or more special-purpose computing devices. The special-purpose computing devices may be hard-wired to perform the techniques or may include digital electronic devices such as one or more application-specific integrated circuits (ASICs) or field programmable gate arrays (FPGAs) that are persistently programmed to perform the techniques or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 4 is a block diagram that illustrates a computer system 400 upon which some embodiments of the invention may be implemented. Computer system 400 includes a bus 402 or other communication mechanism for communicating information, and a hardware processor 404 coupled with bus 402 for processing information. Hardware processor 404 may be, for example, a general-purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk, optical disk, or solid-state drive is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 410. Volatile media includes dynamic memory, such as main memory 406. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infrared data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infrared signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic, or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the worldwide packet data communication network now commonly referred to as the "Internet" 428. Local network 422 and Internet 428 both use electrical, electromagnetic, or optical signals that carry digital data streams.

The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

3. GENERATING A FIELD ERROR MODEL USING MEASURED FIELD DATA

Figure 7:
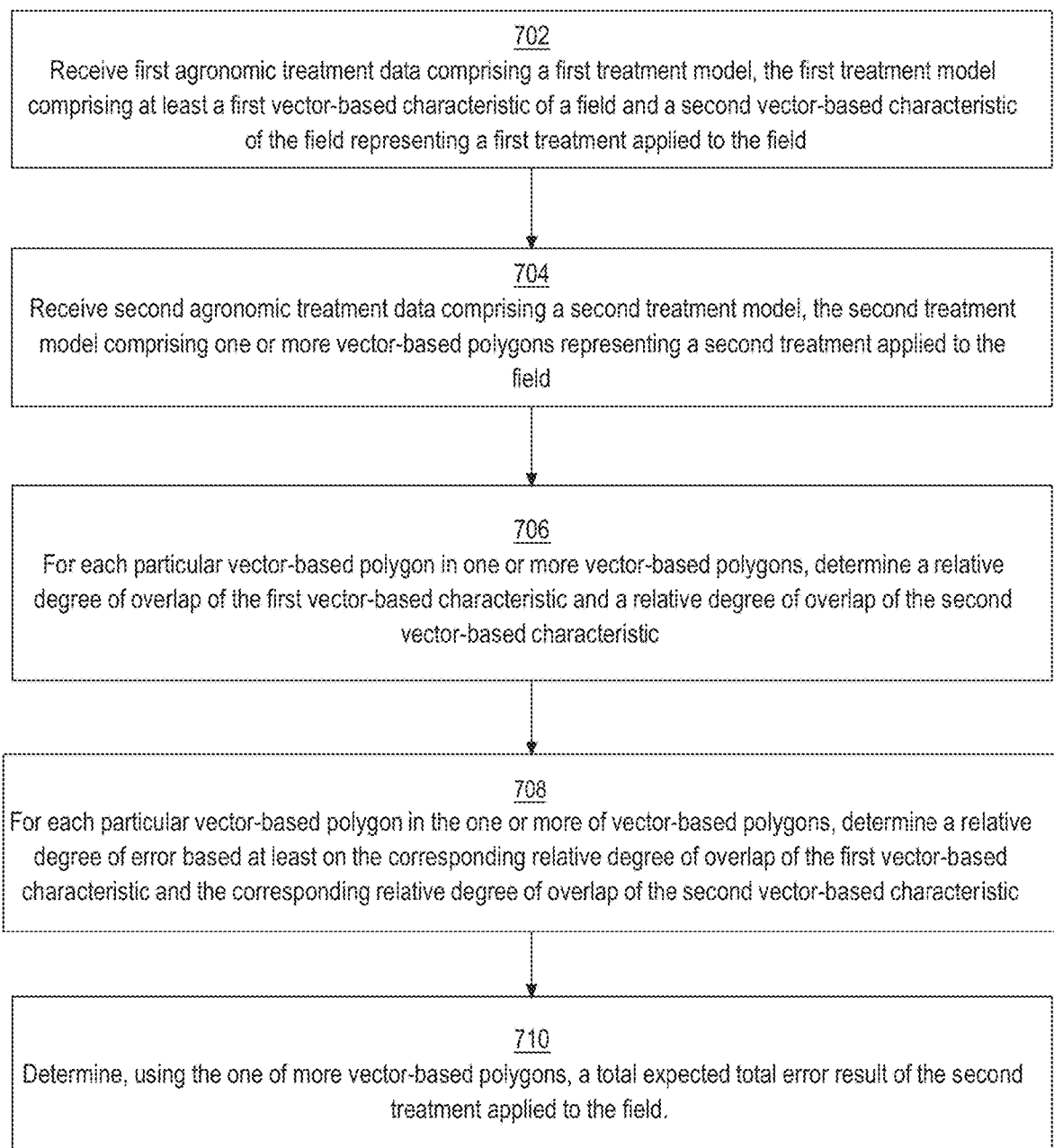
FIG. 7 depicts an example method for using collected implement data to determine procedural error in applying a treatment to an agronomic field.

FIG. 7 depicts an example method for using collected implement data to determine procedural error in applying a treatment to an agronomic field. As an example, FIG. 7 depicts a flow diagram representing a method for utilizing collected data from field activities to determine a degree and/or rate of error for a particular measured treatment applied at a field. The method described in FIG. 7 may be programmed in or implemented by the agricultural intelligence computer system in order to supply error information to a variety of entities including implement operators, agricultural managers, agronomic data scientists or any other entity which benefits from a method of determining error in treatment application.

At step 702, first agronomic treatment data is received comprising a first treatment model, the first treatment model comprising at least a first vector-based characteristic of a field and a second vector-based characteristic of the field representing a first treatment applied to the field. The first agronomic treatment data may be received from any source and in any format necessary to perform the steps depicted in FIG. 7. For example, sources may include, but are not limited to, one or more remote sensors 112, the cab computer 115, the model and field data repository 160, and/or a wireless connection connecting a field implement to a network. Formats may include, but are not limited to, raw numerical data, human-readable data, probability/statistical data, and/or field modelling data. In various embodiments, an active field implement generates and stores data using the agricultural intelligence computer system in real-time. In one embodiment, real-time action refers to the agricultural intelligence computer system executing one or more operations immediately after receiving input from one or more entities, or within a few seconds of receiving the data. In one embodiment, near real-time action refers to the agricultural intelligence computer system executing one or more operations within a period of time comprising a relatively short delay or response period between the reception of an input and the execution of action responsive to the input.

For example, the first agronomic treatment data may include data generated and sent to the agricultural intelligence computer system from a seeding implement actively operating in the field. As the seeding implement traverses the field, a computer element in the implement may actively and periodically measure and compile data regarding the position and placement of seeds in the field. In some embodiments, the first agronomic treatment data comprises or is used to generate a model representing activities in a field. For example, as a seeding implement traverses a field, a digital representation of the field may be generated corresponding to the physical field containing the implement. The digital model of the field may be populated with data in real-time as the implement traverses the field. For example, a digital model of a field may be populated with data corresponding to particular sections or vectors of a specific seed as the seeding implement traverses the field in a particular direction.

Data generated by an agricultural implement may represent a characteristic of a field or a treatment applied to the field by the implement. For example, a digital model of a field traversed by a seeding implement may be updated to show particularly oriented rows of hybrid crops which were planted in a corresponding fashion. This representation is an active characteristic of a field and may correspond to or be associated with separate vector information identifying the distinguishing properties of the characteristic in the field. In various embodiments, a field may contain one or more implements and/or one or more treatments which correspond to distinct characteristics of the field. For example, a seeding implement may sow seeds in a field during a single traversal of the field but may sow different seeds in an alternating fashion with each subsequent traversal of the field. In this manner, a field may contain several distinct characteristics which may be associated with or represented by distinct vector-based values in the field mode. An example of such a model is shown below in FIG. 8.

In various embodiments, first agronomic treatment data is received subsequently to a field activity by the agricultural intelligence computer system. For example, a field implement may generate first agronomic data during a field traversal and store the data for later use by the agricultural intelligence computer system. The data may be stored in any location suitable for the treatment data, including, but not limited to, the model and field repository data 160, the data server computer 108, or the cab computer 115. In various embodiments the agricultural intelligence computer system receives measured field data from a field implement and generates the first treatment model. The agricultural intelligence computer system may then store the first treatment model in a computer storage until subsequent treatments are ready to be or have been made to the same field.

At step 704, second agronomic treatment data is received, the second agronomic data comprising a second treatment model, the second treatment model comprising one or more vector-based polygons representing a second treatment applied to the field. The second agronomic treatment data may be received from any source and in any format necessary to perform the steps depicted in FIG. 7. Sources and formats of data received may be similar or different than those discussed above with regard to the first agronomic data.

The received second agronomic data may relate to any model or data representing a second treatment applied to a field. In various embodiments, the treatment applied to a field is associated with one or more traversal patterns of an agricultural implement in a field. For example, a harvesting implement traversing a field may be associated with a particular vector of travel and/or a covered area of traversal which encompasses all of, or a portion of, a digitally modelled field. The harvesting implement performs treatments covering a particular area in a particular direction of travel. As the harvesting implement traverses the field, a particular two-dimensional area of the field is covered by treatments from the harvesting implement.

Figure 9:
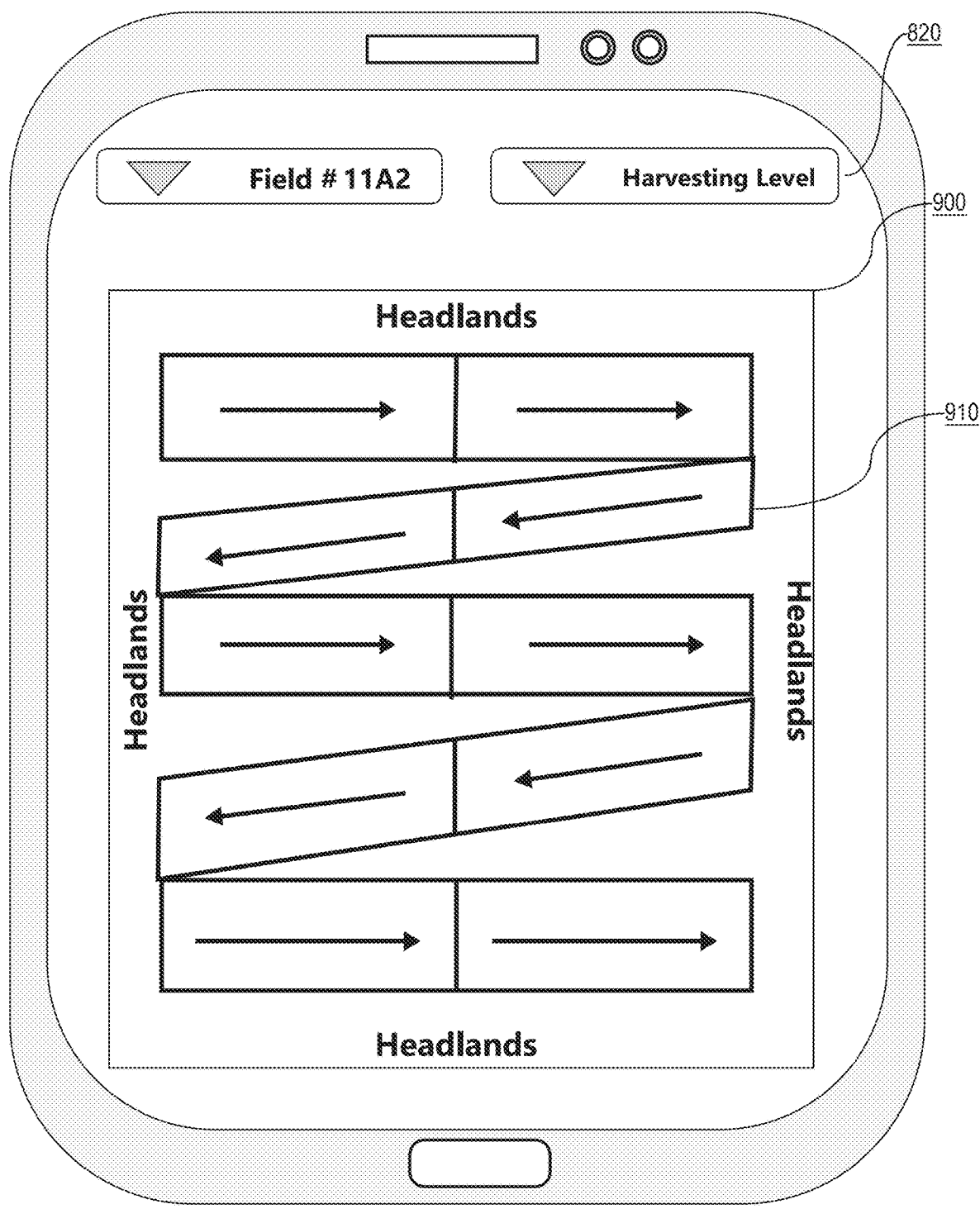
FIG. 9 depicts an example field model for implementing traversal paths according to some embodiments.

In various further embodiments the one or more traversal patterns comprise one or more sub-patterns, or "polygons" of traversal according to a second treatment model. For example, as a harvesting implement covers a particular dimensional area of the field during traversal, certain portions of the covered area may be closed from the other areas of traversal to generate a polygon of traversal. A polygon of traversal covers a fixed portion of the field which has been traversed and is distinct from other portions of the field which have been traversed. In various embodiments, a single polygon represents the entire traversal pattern of the implement. In various embodiments, the entire traversal pattern of the implement is split into one or more polygons based on regular time-based periods during which the implement traverses the field. In various embodiments, the entire traversal pattern of the implement is split into one or more polygons based on distance-based or grid-based constraints on polygon size. For example, each horizontal traversal of a field may be split into two separate polygons at a bisection midway point running vertically through the field. An example of such embodiments is depicted in FIG. 9 below.

At step 706, a relative degree of overlap of the first vector-based characteristic and a relative degree of overlap of the second vector-based characteristic are determined for each particular vector-based polygon of the one or more vector-based polygons. In various embodiments, an overlap of a characteristic in a polygon is determined by an amount of area within the polygon corresponding to the characteristic relative to the first agronomic data. For example, the second treatment model comprising the one or more vector-based polygons may be overlaid onto the first treatment model to form a composite model depicting the one or more vector-based polygons relative to the at least two characteristics of the field. The overlay may be performed on any device or system capable of displaying the overlay, such as field manager computer device 104, cab computer 115, and/or any personal computing device connected to the agricultural intelligence computer system 130. An example of a composite model is depicted in FIG. 10, below.

In various embodiments a relative degree of overlap for first vector-based characteristics and a relative degree of overlap for second vector-based characteristics are determined for each polygon of traversal. For example, a particular polygon of traversal may correspond to a first horizontal traversal of a field by a harvesting implement up to a mid-field cutoff line. The resulting polygon, when compared with the first treatment model, may show that the harvesting implement harvested only crops corresponding to a first hybrid crop characteristic and no crops corresponding to a second hybrid crop characteristic. In this case, the relative degree of overlap of the first hybrid is 100% or 1.0, and the relative degree of overlap of the second hybrid is 0% or 0.0.

As a further example, a particular polygon of traversal may correspond to a second horizontal traversal of a field by a harvesting implement beginning at a mid-field cutoff line and ending at an empty section of field, or "headland". The resulting polygon, when compared with the first treatment model, may show, for example, that the harvesting implement harvested crops corresponding to a first hybrid crop characteristic three times as often as crops corresponding to a second hybrid crop characteristic. In this case, the relative degree of overlap of the first hybrid is 75% or 0.75, and the relative degree of overlap of the second hybrid is 25% or 0.25. An example of relative overlap of characteristics is given in FIG. 11, below.

At step 708, a relative degree of error is determined for each particular vector-based polygon in the one or more vector-based polygons. The degree of error is derived from the determined relative degrees of overlap of the first vector-based characteristic and the second vector-based characteristic. The relative degree of error determined may be any data, metric, determination, model, or other measurement that represents a degree of error for the second treatment performed at the field. In various embodiments, a degree of overlap determined at each vector-based polygon is used to determine individual degrees of error for each vector-based polygon. For example, a degree of error may correspond to a relative proportion of the first characteristic contained in a polygon to the second characteristic contained in the polygon.

At step 710, a total expected total error result of the second treatment as applied to the field is determined from the one or more vector-based polygons. In various embodiments, the total error result is the summation of the error rates of the individual vector-based polygons. In various embodiments, the total expected error rate is a mean value of the error rates of the individual vector-based polygons.

3.1. Measurement of Planting Data

Figure 8:
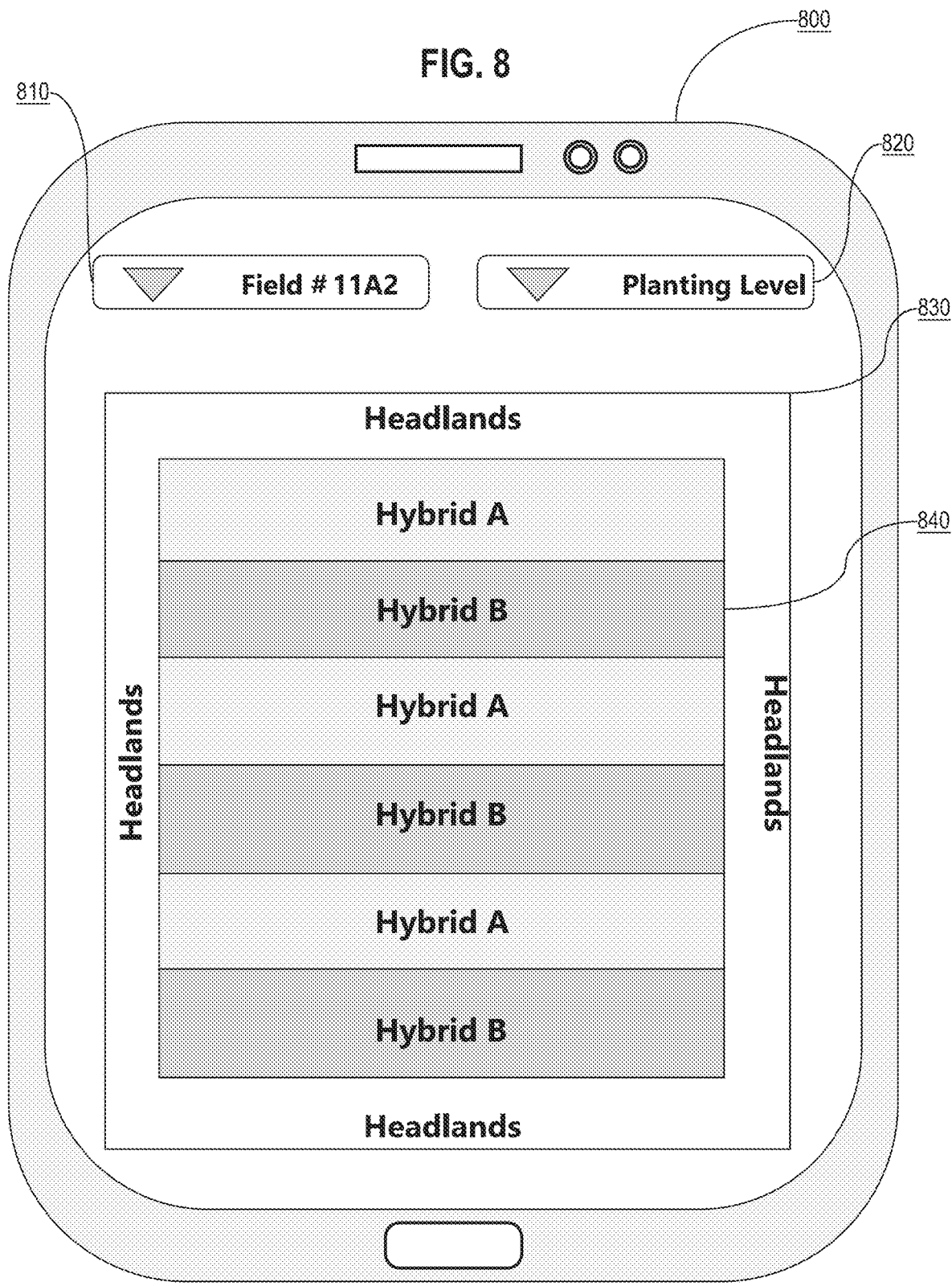
FIG. 8 depicts an example field model for planted hybrid crops according to some embodiments.

FIG. 8 depicts an example field model for planted hybrid crops according to some embodiments. As an example, FIG. 8 depicts a first treatment model representing a treatment to a field. For example, FIG. 8 shows a GUI, implemented in a device, that depicts several horizontally oriented rows of polygons representing hybrid crops in a field. Device 800 may be any device on which field data or data relating to treatments at a field may be displayed. For example, the device 800 is or is related to field manager computer device 104, cab computer 115, and/or any personal computing device connected to the agricultural intelligence computer system 130. As depicted in FIG. 8, device 800 currently displays a graphical depiction of a field according to the application of a planting treatment.

Field list 810 is a list menu displayed on device 800 which may be interactive with respect to a user. A user may be any entity which benefits from use of an interface on device 800, including a field manager, an implement operator, a data scientist, or any other entity which may employ the methods described herein. As depicted in FIG. 8, field list 810 is a menu which currently is in a state selecting FIELD #11A2 for viewing. Level list 820 is a list menu displayed on device 800 which may be interactive to the user and may be selected from to determine which view or treatment of a field is played on the GUI. As depicted in FIG. 8, level list 820 is a menu which currently is in a state selecting PLANTING LEVEL. As a result of these selections, device 800 currently displayed on a graphical user interface a planting treatment applied to FIELD #11A2 via plant model 830. Plant model 830 may be any field or a digital representation of a field or treatment to a field. Plant model 830 contains areas of the field that are subjected to treatments as well as areas not of the field not subjected to treatments, such as headlands which are areas of the field in which field operators may turn or reorient field implements for subsequent treatments.

Plant model 830 contains hybrid characteristic 840. In various embodiments, a characteristic such as hybrid characteristic 840 represents a particular area of a field corresponding to a previous treatment or placement of crops. For example, hybrid characteristic 840 as depicted in FIG. 8 represents HYBRID B which is a hybrid crop of a specific genus or species of crop. The polygon corresponding to hybrid characteristic 840 represents a specific area of the field in which a planting implement sowed seeds for HYBRID B at some previous time during a previous treatment.

Plant model 830 contains multiple hybrid characteristics of HYBRID A and HYBRID B. As depicted in FIG. 8, HYBRID B is a different type of crop than HYBRID A and may require different styles of planting, maintenance, or harvesting than HYBRID A. Accordingly, HYBRID B may need to be harvested in a different manner than HYBRID A during a harvesting treatment at the field.

In various embodiments, one or more characteristics of a field correspond to polygons representing planting treatments applied to a field. In various further embodiments, a farming implement, such as a seeding implement, actively collects data during a seed sowing treatment at a field. As the implement performs the treatment, active data is measured, collected, compiled and/or transferred to the agricultural intelligence computer system. Collected data may be any data sufficient to determine and generate data representing one or more characteristics at a field. For example, a seeding implement at a field may actively and periodically send positional data to the agricultural intelligence computer system. The positional data of the implement corresponds to a GPS measured location of the implement in the field.

An active implement may send any amount of data to the agricultural intelligence computer system. For example, creating a model such as the first treatment model depicted in FIG. 8 may require several variables, including the properties of crop Hybrid A, the properties of crop Hybrid B, the area of the field and headlands, the width of the treatment applied by the implement, and the position of the planting implement as it traverses the field. In various embodiments, the first treatment model is actively generated by the agricultural intelligence computer system as the implement collected data traversing the field. In various embodiments, the generated model is displayed in real time or near real time to an entity, such as an agricultural manager, an operator of the field implement, or any other entity which benefits from the knowledge of the first treatment model.

3.2. Measurement of Harvesting Data

FIG. 9 depicts an example field model for implementing traversal paths according to some embodiments. As an example, FIG. 9 depicts a second treatment model representing a treatment to a field as displayed on the GUI of device 800. For example, FIG. 9 shows patterns of traversal of a field implement as it traverses the field. As depicted in FIG. 9, level list 820 has been set to a state of selection for a harvesting level to be shown on device 800. As a result, harvest model 900 is depicted, which may be any field or a digital representation of a field to which a treatment has been applied. Harvest model 900 contains digital representations of traversal patterns in the field broken into individual polygons contained within the field model.

Harvest model 900 contains a plurality of traversal polygons such as traversal polygon 910. In various embodiments, a traversal polygon such as traversal polygon 910 represents a particular area of a field which was subjected to a treatment by a field implement. For example, the polygons shown in harvest model 900 represent a pattern of traversal of a field implement performing a treatment at the field. The traversal pattern is broken into individual traversal polygons to increase the fidelity of traversal data and improve the accuracy of data collection. For example, traversal polygon 910 as depicted in FIG. 9 is a polygon of traversal of a farming implement which is formed during a second "pass" of traversal of the field enclosed by a beginning threshold corresponding to a beginning threshold of the field and the midway line of the field.

In various embodiments, the pattern of traversal and resulting traversal polygons correspond to a treatment applied to a field. In various further embodiments, a farming implement, such as a harvesting implement, actively collects data during a harvesting treatment at a field. As the implement performs the treatment, active data is measured, collected, compiled and/or transferred to the agricultural intelligence computer system. Collected data may be any data sufficient to determine and generate data representing the treatment and/or traversal of the field. For example, a harvesting implement at a field may actively and periodically send positional data to the agricultural intelligence computer system. The positional data of the implement corresponds to a GPS measured location of the implement in the field.

An active implement may send any amount of data to the agricultural intelligence computer system. For example, creating a model such as the second treatment model depicted in FIG. 9 may require several variables, including the area of the field and headlands, polygonal characteristics of the field, the width of the treatment applied by the implement, and the position of the planting implement as it traverses the field. In various embodiments, the second treatment model is actively generated by the agricultural intelligence computer system as the implement collected data traversing the field. In various embodiments, the generated model is displayed in real time to an entity, such as an agricultural manager, an operator of the field implement, or any other entity which benefits from the knowledge of the first treatment model.

In various further embodiments, displaying the pattern of traversal through the second treatment model may comprise generating and displaying recommended information for applying the treatment to the field in real time. For example, the agricultural intelligence computer system may interpret actively collected data from the field implement to generate and display recommended changes to the operation of the implement in real time. Such recommendations may include, changing acceleration, speed, direction, position, treatment application or treatment type to the field in any combination. In various embodiments, the agricultural intelligence computer system may automatically control, steer, restrict, or otherwise cause the implement to effectuate the recommended changes in the field. For example, the agricultural intelligence computer system may cause the implement to move through the field at a speed restricted to below a threshold speed based on the generated recommendation.

3.3. Applied Model Comparison and Vector Analysis

Figure 10A:
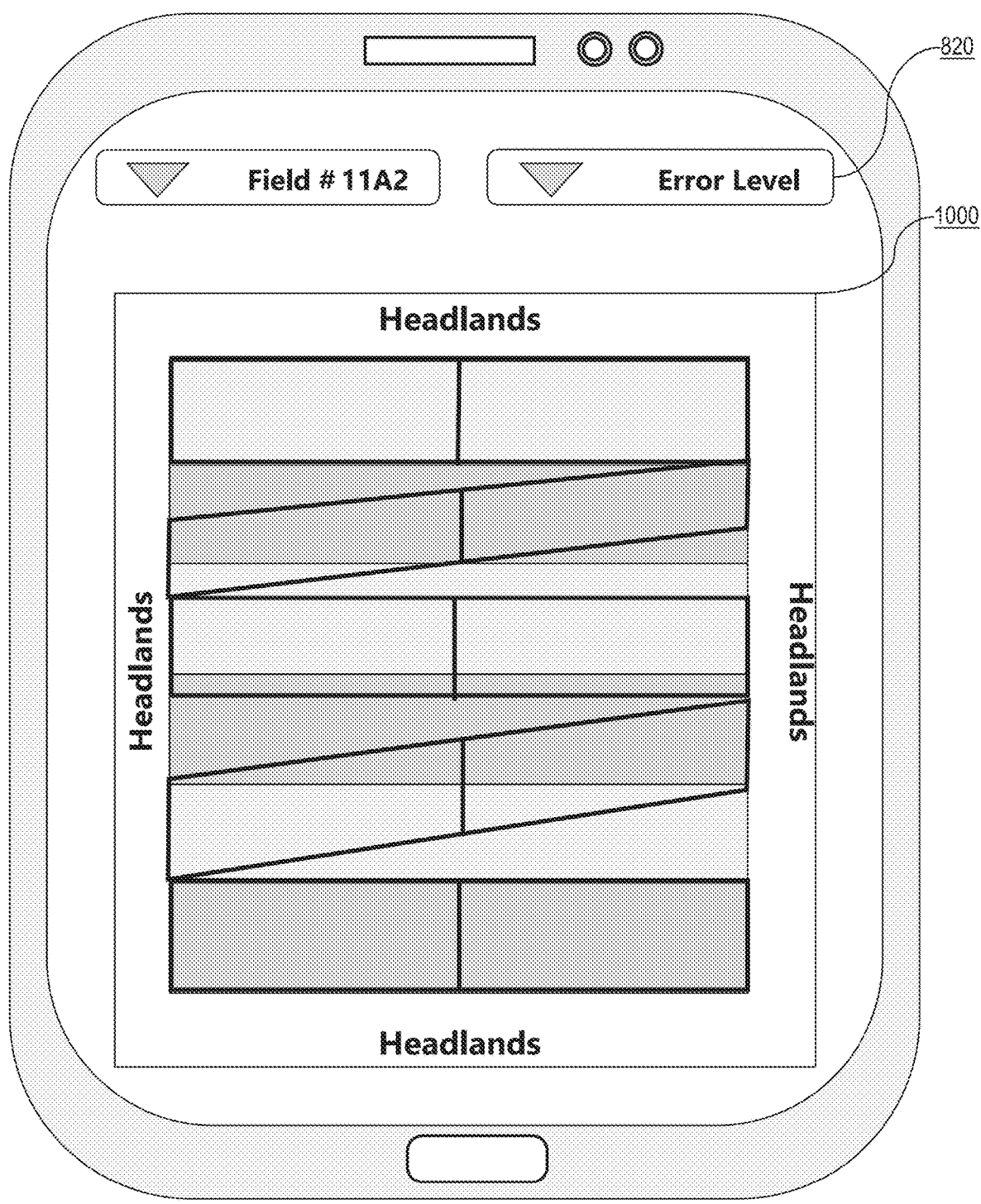
FIG. 10A depicts an example field model including an overlay of measured planting data with measured implement traversal data according to some embodiments.

FIG. 10A depicts an example field model including an overlay of measured planting data with measured implement traversal data according to some embodiments. As an example, FIG. 10A depicts an overlay of the second treatment depicted in FIG. 9 relative to the first treatment depicted in FIG. 8. As depicted in FIG. 10A, level list 820 has been set to a state which will display, on the GUI of device 800, a composite field model representing degrees of error in the second treatment. In various embodiments, comparing the result of two or more treatments generates data which the agricultural intelligence computer system can use to determine results of treatments at the field. For example, the overlay and resulting composite model 1000 depicted in FIG. 10A shows the routes of traversal of the field by an agricultural implement during the second treatment relative to the constraints and bounds of the characteristics formed by the first treatment in order to create composite model 1000.

Relative to the planting and harvesting examples given above, FIG. 10A may represent a pattern of traversal of a harvesting implement after a separate planting implement has traversed the field while sowing seeds. It may be beneficial for a harvesting implement to traverse the field in a vector pattern congruent to the seed sowing pattern of the seeding implement. Because crop HYBRID A may have some properties which differ from crop HYBRID B, it may be optimal to harvest crop HYBRID A in a particular manner and harvest crop HYBRID B in a different manner.

For example, crops such as wheat and canola produce different grain yield depending on the stubble of the crop, or how much of the crop is left after harvest occurs. Because wheat and canola may require different levels of stubble for optimal yield, it is recommended that implement operators in the field adjust the height of a harvesting combine to an optimal level before traversing a section of hybrid crops. Accordingly, harvesting canola when a combine harvester is optimized for wheat harvest may not only contaminate the wheat yield, but may also produce less than optimal yield of canola. While certain crops, implements, and treatments are discussed as examples for the purposes of providing a clear description of the methods and systems described herein, it is appreciated that those methods and systems are agnostic with respect to the crops, implements and treatments used.

Returning to the composite model in FIG. 10A, an overlay of traversal compared to crop characteristics advantageously shows a degree of error for each traversal polygon of the second treatment. As depicted in FIG. 10A, several traversal polygons of the second treatment model are shown to intersect both characteristics of the field produced by the first treatment, representing potential error during the second treatment. Using the traversal polygons and characteristics of the second and first models, it can be determined what amount of characteristic overlap occurred at particular polygons of traversal.

In various embodiments, the agricultural intelligence computer system automatically determines an optimal proportion of overlap for each polygon to compare to the measured proportion of overlap for each polygon. In various embodiments, the agricultural intelligence computer system determined the optimal proportion based on the measured degree of overlap. For example, the agricultural intelligence computer system may determine that an optimal overlap for a polygon encompasses a 1.0:0.0 proportional overlap for the characteristic with a larger measured amount of overlap. In this case, any polygon having an overlap with a characteristic over 51% of the area of the poly, is determined to have an ideal overlap of 100% of that characteristic. In various embodiments the agricultural intelligence computer system determines an optimal overlap for a polygon based on a measured position of an implement at the poly relative to a characteristic. For example, if a polygon is directly adjacent or contains a similar vector to the characteristic, the agricultural intelligence computer system will determine that the polygon should optimally overlap with the characteristic at a 100% rate.

In various embodiments, the agricultural intelligence computer system determines a measured yield of crops in a polygon based on an area weighted mass allocation formula. For example, the agricultural intelligence computer system may split a polygon into separate sub-polygons in order to determine hybrid yield at each of the sub-polygons. In this case, the agricultural intelligence computer system can divide traversal polygons according to overlap with different characteristics and determine yield for each of the sub-polygons when each of the sub-polygons encompass 100% overlap with a characteristic of the field. In this manner, the agricultural intelligence computer system can control field data for grower induced error and make a proper determination of hybrid yield at a particular traversal polygon.

In various embodiments, a polygon is represented by a data structure accessible to the agricultural intelligence computer system. For example, a polygon may be a digital data object having fields such as physical area, overlap rates of characteristics, and/or coordinate data representing the location and shape of the polygon. In various embodiments, elements of a polygon's data type may be used to modify the way in which metrics are derived from and applied to the polygon. For example, if each polygon has an area metric representing the squared length of the two-dimensional polygon, polygons having a higher value of area are more impactful to the treatment data than polygons having smaller error. Accordingly, a summation of overlap values to determine a rate of error for the treatment may be weighted by polygon, wherein larger area polygons impact the rate of error more heavily than smaller area polygons.

3.4. Applications of Generated Error Models

Figure 10B:
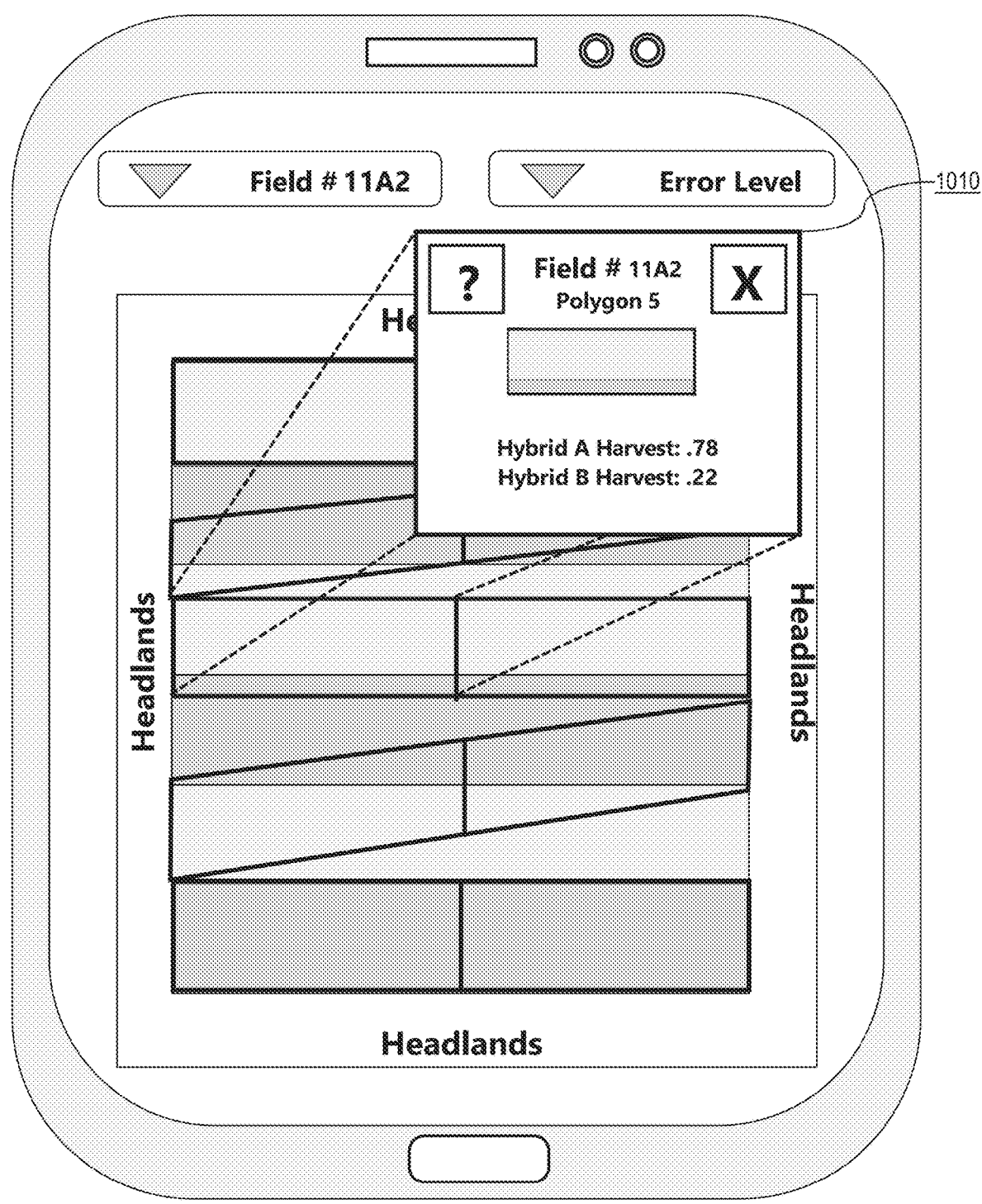
FIG. 10B depicts an example field model including sectional field data relating to a degree of error measured in a field according to some embodiments.

FIG. 10B depicts an example field model including sectional field data relating to a degree of error measured in a field according to some embodiments. As an example, FIG. 10B depicts quantified levels of overlap in characteristics in particular traversal polygons determined from the composite model of FIG. 10A. As depicted in FIG. 10B, certain traversal polygons have been analyzed and overlap has been quantified by the agricultural intelligence computer system. For example, overlap identifier 1010 displays the particular metrics of overlap associated with a traversal polygon identified as POLYGON 5 in the composite model. According to overlap identifier 1010, all of traversal polygon POLYGON 5 overlaps both a portion of characteristic HYBRID A and HYBRID B. A corresponding ratio indicator shows a proportion of 0.78 overlap of HYBRID A in POLYGON 5 and a proportion of 0.22 overlap of HYBRID B in POLYGON 5.

In various embodiments, the agricultural intelligence computer system utilizes collected data at each traversal polygon to determine an overall rate of induced error for the second treatment of the field. For example, the agricultural intelligence computer system may use a summation formula of all traversal polygons to determine an overall rate of error based on the overlap ratios of each traversal polygon. The resulting metric may be a quantified induced error rate of one or more field treatments. For example, the agricultural intelligence computer system may interpret rates of overlap for minority characteristics for each polygon and report the mean rate of error for the total set of polygons as an induced error rate of the second treatment.

In various embodiments, the induced error rate is utilized as a separate metric to determine or modify another derived rate, such as a total yield metric. For example, the agricultural intelligence computer system may utilize the known induced error rate for a treatment to modify an overall yield metric to account for the error in measured yields of crops. In this manner, the agricultural intelligence computer system may process that a treatment was more effective than yield data indicates because induced error in applying the treatment contaminated measured results.

In various embodiments, the induced error rate due to treatment mixing of a polygon or a set of polygons representing measured results of treatment may be indicative of an overall state of a field or treatment. For example, a particular rate of induced error may cause the agricultural intelligence computer system to classify a polygon or field as "contaminated" if the error rate is above a certain threshold. For example, the presence of an error contamination in a treatment or field may be represented by the equation $$C = \frac{1 - \sum_i f_{i,T}^2 * A_i}{\sum_i f_{i,T} * A_i}$$

where C is the contamination term, the summations are performed across all harvest polygons indexed by i, $f_{i,T}^2$ is the fraction (by area) of treatment present in a given harvest polygon with index i, and $A_i$ is the area of a given harvest polygon with index i. As a threshold example, the agricultural intelligence computer system may only recognize fields or treatments having a contamination term above 0.05 to be contaminated by error.

In various embodiments, the agricultural intelligence computer system utilizes the contamination term to derive and display a unique value to represent an experienced yield of harvested crops during a treatment. For example, the experienced yield of a treatment may be represented by the equation $$Y_T^{experienced} = (1-C)*Y_T + C*Y_0$$

where $Y_T^{experienced}$ is the derived experienced yield of the treatment, C is the contamination term, $Y_T$ is the unobserved, actual yield of the target treatment of interest and $Y_0$ is the unobserved, actual yield of the other treatments that are contaminating the target treatment yield outcome. The experienced yield represents the yield from a harvesting treatment according to actual user-generated treatment and harvest data.

In various embodiments, the agricultural intelligence computer system utilizes the induced error rate to modify or suggest changes to operation of a field at present or future times. For example, the agricultural intelligence computer system may determine an induced error rate to be data indicative of a GPS error and automatically perform or recommend that a user perform a recalibration of the implement's GPS capabilities. Changes to operation may be given to an operator of an implement in real time. For example, an agricultural implement may receive an indication from the agricultural intelligence computer system that grower induced error is detected during a treatment and instruct the operators to recalibrate equipment or change direction while in the headlands. For example, the agricultural implement may receive a warning signal on the cab computer which clearly indicates to an operator of the implement that the implement is travelling in a manner which increases contamination risks and recalibration should be performed. In another example, the agricultural implement may receive a weather warning symbol indicating that incoming winds risk contaminating a harvesting operation and the operation should cease operation temporarily.

In various embodiments, derived data including an induced error rate may be used to generate and display graphs to aid implement operators, agricultural researchers, and "alpha" testing entities which derive and test experimental treatments. Examples of graphs include, bar graphs, histograms, line graphs, or any other chart or graph which represents the derived data described herein. In one example, a histogram may measure a percentage or flat number of fields which are contaminated in a degree according to the contamination term.

In various embodiments, measured values, derived values, or other data described herein may be used as part of a machine-learning system operating at or in conjunction with the agricultural intelligence computer system. For example, a machine-learning system may be derived and implemented as part of the agricultural intelligence computer system to determine the effectiveness of treatments at a field using a variety of variable conditions. One input into the machine learning model may be the calculated induced error rate based on treatments to the field. Such a machine learning model may apply different rates of induced error to determine the effect of error on the overall yield differences in different treatment applications.

Figure 11A:
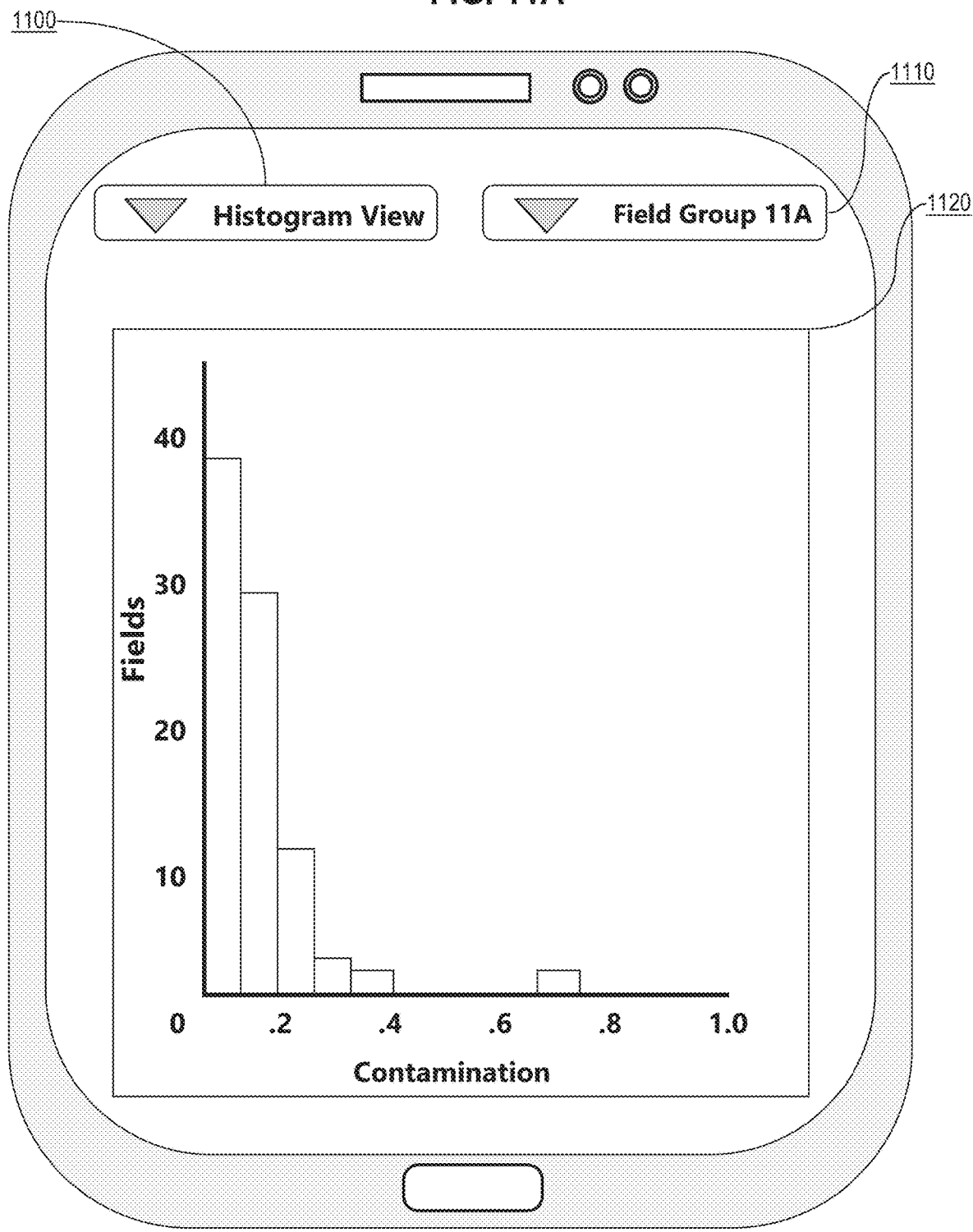
FIG. 11A depicts an example graphical model including data related to error-based contamination of field groups.

Additionally, the information regarding error and contamination at a field may be modelled and graphed for an entity to view results of an error measurement. FIG. 11A depicts an example graphical model including data related to error-based contamination of field groups. As depicted in FIG. 11A, graph list 1100 is selected to generate a HISTOGRAM VIEW and field list 1110 is set to specify that FIELD GROUP 11A will be the subject of the histogram. As a result of these selections, histogram 1120 is generated representing contamination rates of fields from the group 11A. The x-axis of the histogram represents the derived value of contamination at a field and the y-axis represents the total number of the fields in the group having a particular contamination value. Such a graph is useful to entities studying field error in order to determine overall rates of error and the rate of occurrence of those errors that result in contamination.

Figure 11B:
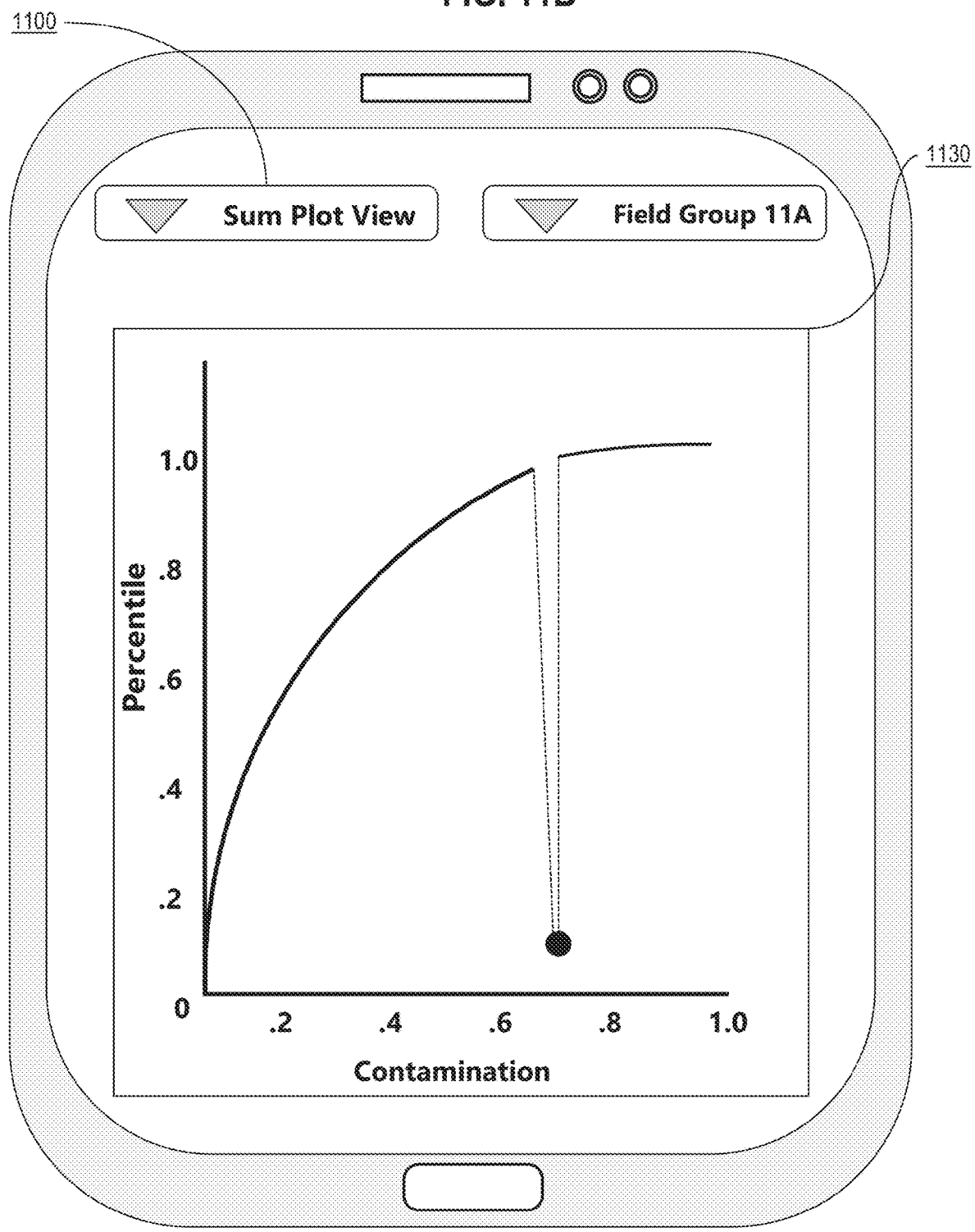
FIG. 11B depicts an example graphical model including data related to error-based contamination of field groups.

FIG. 11B depicts an example graphical model including data related to error-based contamination of field groups. As depicted in FIG. 11B, graph list 1100 has been set to a state selecting the generation of a sum plot graph for field group 11A. As a result, sum plot 1130 is generated in the GUI of device 800. The sum plot shows a percentage of fields in the group which have a particular contamination value. The x-axis of the graph represents the contamination value, and the y-axis of the graph represents the percentage of fields having a particular contamination value.

4. PRACTICAL APPLICATIONS

In some embodiments, the determination of error and recommended corrections are utilized as part of a practical application of managing an agronomic field. For example, the agricultural intelligence computer system may use the contamination values and models to calibrate the operation of agricultural implements and recommend operations for mitigating error in future operations. The models generated may be used to generate recommendations for agricultural management activities, such as changes in planting, fertility, weed control, irrigation, and/or harvesting of a crop.

In some embodiments, the agricultural intelligence computer utilizes the contamination values to monitor, in real time or near real time, various sets of contamination to assess an overall error rate or efficiency rate of treatments performed at a field. The rates and collected date may be compiled in order to improve future field operations. For example, the agricultural intelligence computer system may use stored digital models to identify a major offending factor of contamination, such as equipment failure, miscalibration, weather interference, human error, field shape, or any other factor which may affect treatments applied to a field. The agricultural intelligence computer system may then recommend or automatically correct operations of the agricultural implements to correct errors or contamination detected during field operations over a period of time.

In some embodiments, the agricultural intelligence computer system additionally causes implementation of the recommendations to mitigate contamination at an agronomic field by generating one or more scripts. The scripts comprise computer readable instructions which, when executed by an application controller, causes the application controller to control an operating parameter of an agricultural implement on the agronomic field to apply a treatment to the trial portion of the agronomic field in a revised manner. The scripts may be configured to match the generated models of contamination such that the scripts, when executed, cause one or more agricultural implements to execute the corrections or recalibrations while working a field. For example, models gleaned from field treatments may indicate that contamination error increases exponentially with increases in wind speed perpendicular to a direction of harvesting at a field. The agricultural intelligence computer system may then generate and implement a script to alter the harvesting course of a harvesting implement to a degree proportional to a perpendicular windspeed detected at the field in real time.

In some embodiments, the agricultural intelligence computer system generates an improved display by including, in the display, the expected error or contamination rates which may correspond to operation of an agricultural implement, or the actual error or contamination rates as measured in a field in real time. The display may comprise a map display which uses pixel values to indicate polygon shapes or models corresponding to expected or real time contamination occurring at a field.

In some embodiments, instructions may be added to agricultural intelligence computer system 130 to utilize historical or adjusted actions or treatments which have contributed to contamination to modify the operation of an implement. For example, instructions may be sent to agricultural intelligence computer system 130 comprising data relating to a historical rate of contamination at a field. The historical data may be used to predict or analyze trends in contamination to determine future calibrations to operations which should be recommended.

5. BENEFITS OF CERTAIN EMBODIMENTS

When considered in light of the specification herein, and its character as a whole, this disclosure is directed to improvements in the use of monitoring systems and treatments to measure expected or active contamination due to treatments. The disclosure is not intended to cover or claim the abstract model of analyzing data, but rather to the practical application of the use of computers and sensors to actively recommend and alter operations of an agricultural implement or treatment to decrease contamination and increase effective harvesting yield.

By correcting determined contaminating actions, the system is additionally able to improve the accuracy, reliability, and usability of field treatments and increase total and efficient yield of crops. Thus, implementation of the invention described herein may have tangible benefits in increased agronomic yield of a crop, reduction in resource expenditure while managing a crop, and/or improvements in the crop itself.

6. EXTENSIONS AND ALTERNATIVES

In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction.

What is claimed is:

1. A computer-implemented method for collecting and utilizing measured field data as part of a practical implementation of an error detection and quantification system for operations of an agricultural implement or treatment in an agronomic field, the method comprising:
   receiving, by an agricultural intelligence computer system, first agronomic treatment data comprising a first treatment model, the first treatment model comprising at least a first vector-based characteristic of a field and a second vector-based characteristic of the field representing a first treatment applied to the field;
   receiving second agronomic treatment data comprising a second treatment model, the second treatment model comprising one or more vector-based polygons representing a second treatment applied to the field;
   for each particular vector-based polygon in the one or more vector-based polygons, determining a relative degree of overlap of the first vector-based characteristic and a relative degree of overlap of the second vector-based characteristic;
   for each particular vector-based polygon in the one or more vector-based polygons, determining a relative degree of error based at least on a corresponding relative degree of overlap of the first vector-based characteristic and a corresponding relative degree of overlap of the second vector-based characteristic;
   determining, using the one or more vector-based polygons, a total expected total error result of the second treatment applied to the field;
   generating a graphical representation of the total expected total error result of the second treatment applied to the field and transmitting the graphical representation of the total expected total error result of the second treatment to a display device to cause the display device to display, using a graphical user interface, the graphical representation of the total expected total error result of the second treatment; and
   providing a recommendation, using the graphical user interface, based on the total expected total error result of the second treatment to decrease contamination and increase effective harvesting yield of the field; wherein the recommendation include one or more corrective actions for operations of the agricultural implement or treatment.

2. The method of claim 1, wherein the first agronomic treatment data pertains to a first treatment to the field;
   wherein the first agronomic treatment data comprise one or more characteristics of the field which can be modelled in a position and/or vector-based format;
   wherein the first treatment comprises a number of seeds planted in the field in a specific pattern;
   wherein planting of the number of seeds in the field includes planting, by a farming implement active in the field, in horizontally or vertically aligned rows of agricultural seeds;
   wherein every other row of planted seeds contains a same hybrid genus or species of crop.

3. The method of claim 2, wherein the second agronomic treatment data pertain to a second treatment to the field;
   wherein the second agronomic treatment data comprise a pattern of traversal or treatment applied to the field by the farming implement;

wherein the pattern of traversal or treatment may relate to an orientation of the characteristics of the first treatment;

wherein the second agronomic treatment data represent positional data of the farming implement traversing the field in horizontal patterns to harvest hybrid crops planted therein during the first treatment;

wherein the pattern of traversal of the second treatment is further characterized by regular or periodic positions of the farming implement in the field;

wherein the pattern of traversal is subcategorized according to one or more of: a position of the farming implement, a regular time period of operation of the farming implement, or a shaping of interval polygons generated during field traversal.

4. The method of claim 3, wherein the agricultural intelligence computer system uses the first agronomic treatment data and the second agronomic treatment data to determine differences between one or more locations and one or more orientations of the characteristics and the pattern of traversal of the farming implement.

5. The method of claim 4, wherein the agricultural intelligence computer system determines the differences between one or more locations and one or more orientations of the characteristics based on overall pattern of the traversal of the farming implement.

6. The method of claim 4, wherein the agricultural intelligence computer system determines the difference between one or more locations and one or more orientations of the characteristics based an individual geometric basis for different periods and spatial vectors of travel;

wherein the agricultural intelligence computer system determines the difference based on a number of one or more vector-based polygons corresponding to periods of traversal of the farming implement;

wherein a polygon, of the one or more vector-based polygons, is represented by polygon data that convey one or more aspects of a spatial area;

wherein the one or more aspects of the spatial area includes one or more of: the pattern of traversal, a shape, a work order, treatment or any other data or action performed in the spatial area;

wherein the polygon, of the one or more vector-based polygons, is an enclosed shape representing a portion of a treatment applied to the field;

wherein the polygon data is compared to the first agronomic treatment data to determine a degree of overlap between positional characteristics of the first agronomic treatment and an individual polygon.

7. The method of claim 6, wherein the agricultural intelligence computer system uses the degree of overlap between a traversal polygon and a field characteristic to determine a relative rate of error that occurred during the second treatment at the traversal polygon;

wherein each traversal polygon relating to the second treatment is individually or collectively analyzed to determine the degree of overlap between field characteristics in a set of traversal polygons to determine a rate of error when applying the second treatment;

wherein the agricultural intelligence computer system utilizes determined rates of error to determine a total measured error result of a treatment applied to a field or a total expected error result of a future treatment applied to a field.

8. One or more non-transitory readable-storage media storing instructions for collecting and utilizing measured field data as part of a practical implementation for operations of an agricultural implement or treatment in an agronomic field, which, when executed by one or more computing devices, cause the one or more computing devices to perform:

receiving, first agronomic treatment data comprising a first treatment model, the first treatment model comprising at least a first vector-based characteristic of a field and a second vector-based characteristic of the field representing a first treatment applied to the field;

receiving second agronomic treatment data comprising a second treatment model, the second treatment model comprising one or more vector-based polygons representing a second treatment applied to the field;

for each particular vector-based polygon in the one or more vector-based polygons, determining a relative degree of overlap of the first vector-based characteristic and a relative degree of overlap of the second vector-based characteristic;

for each particular vector-based polygon in the one or more vector-based polygons, determining a relative degree of error based at least on a corresponding relative degree of overlap of the first vector-based characteristic and a corresponding relative degree of overlap of the second vector-based characteristic;

determining, using the one or more vector-based polygons, a total expected total error result of the second treatment applied to the field;

generating a graphical representation of the total expected total error result of the second, treatment applied to the field and transmitting the graphical representation of the total expected total error result of the second treatment to a display device to cause the display device to display, using a graphical user interface, the graphical representation of the total expected total error result of the second treatment; and providing a recommendation, using the graphical user interface, based on the total expected total error result of the second treatment to decrease contamination and increase effective harvesting yield of the field; wherein the recommendation include one or more corrective actions for operations of the agricultural implement or treatment.

9. The one or more non-transitory readable-storage media of claim 8, wherein the first agronomic treatment data pertains to a first treatment to the field;

wherein the first agronomic treatment data comprise one or more characteristics of the field which can be modelled in a position and/or vector-based format;

wherein the first treatment comprises a number of seeds planted in the field in a specific pattern;

wherein planting of the number of seeds in the field includes planting, by a farming implement active in the field, in horizontally or vertically aligned rows of agricultural seeds;

wherein every other row of planted seeds contains a same hybrid genus or species of crop.

10. The one or more non-transitory readable-storage media of claim 9, wherein the second agronomic treatment data pertain to a second treatment to the field;

wherein the second agronomic treatment data comprise a pattern of traversal or treatment applied to the field by the farming implement;

wherein the pattern of traversal or treatment may relate to an orientation of the characteristics of the first treatment;

wherein the second agronomic treatment data represent positional data of the farming implement traversing the field in horizontal patterns to harvest hybrid crops planted therein during the first treatment;
wherein the pattern of traversal of the second treatment is further characterized by regular or periodic positions of the farming implement in the field;
wherein the pattern of traversal is subcategorized according to one or more of: a position of the farming implement, a regular time period of operation of the farming implement, or a shaping of interval polygons generated during field traversal.

11. The one or more non-transitory readable-storage media of claim 10, wherein the instructions when executed by the one or more computing devices, cause the one or more computing devices to use the first agronomic treatment data and the second agronomic treatment data to determine differences between one or more locations and one or more orientations of the characteristics and the pattern of traversal of the farming implement.

12. The one or more non-transitory readable-storage media of claim 11, wherein the instructions when executed by the one or more computing devices, cause the one or more computing devices to determine the differences between one or more locations and one or more orientations of the characteristics based on overall pattern of the traversal of the farming implement.

13. The one or more non-transitory readable-storage media of claim 11, wherein the instructions when executed by the one or more computing devices, cause the one or more computing devices to determine the difference between one or more locations and one or more orientations of the characteristics based an individual geometric basis for different periods and spatial vectors of travel;
wherein the instructions when executed by the one or more computing devices, cause the one or more computing devices to determine the difference based on a number of one or more vector-based polygons corresponding to periods of traversal of the farming implement;
wherein a polygon, of the one or more vector-based polygons, is represented by polygon data that convey one or more aspects of a spatial area;
wherein the one or more aspects of the spatial area includes one or more of: the pattern of traversal, a shape, a work order, treatment or any other data or action performed in the spatial area;
wherein the polygon, of the one or more vector-based polygons, is an enclosed shape representing a portion of a treatment applied to the field;
wherein the polygon data is compared to the first agronomic treatment data to determine a degree of overlap between positional characteristics of the first agronomic treatment and an individual polygon.

14. The one or more non-transitory readable-storage media of claim 13, wherein the instructions when executed by the one or more computing devices, cause the one or more computing devices to use the degree of overlap between a traversal polygon and a field characteristic to determine a relative rate of error that occurred during the second treatment at the traversal polygon;
wherein each traversal polygon relating to the second treatment is individually or collectively analyzed to determine the degree of overlap between field characteristics in a set of traversal polygons to determine a rate of error when applying the second treatment;
wherein the instructions when executed by the one or more computing devices, cause the one or more computing devices to use determined rates of error to determine a total measured error result of a treatment applied to a field or a total expected error result of a future treatment applied to a field.

15. A data processing system for collecting and utilizing measured field data as part of a practical implementation for operations of an agricultural implement or treatment in an agronomic field, the data processing system comprising:
one or more computer processors;
storage media; and
instructions stored in the storage media that, when executed by the one or more computer processors, cause the one or more computer processors to perform:
receiving, by an agricultural intelligence computer system, first agronomic treatment data
comprising a first treatment model, the first treatment model comprising at least a first vector-based characteristic of a field and a second vector-based characteristic of the field representing a first treatment applied to the field;
receiving second agronomic treatment data comprising a second treatment model, the second treatment model comprising one or more vector-based polygons representing a second treatment applied to the field;
for each particular vector-based polygon in the one or more vector-based polygons, determining a relative degree of overlap of the first vector-based characteristic and a relative degree of overlap of the second vector-based characteristic;
for each particular vector-based polygon in the one or more vector-based polygons, determining a relative degree of error based at least on a corresponding relative degree of overlap of the first vector-based characteristic and a corresponding relative degree of overlap of the second vector-based characteristic;
determining, using the one or more vector-based polygons, a total expected total error result of the second treatment applied to the field;
generating a graphical representation of the total expected total error result of the second treatment applied to the field and transmitting the graphical representation of the total expected total error result of the second treatment to a display device to cause the display device to display, using a graphical user interface, the graphical representation of the total expected total error result of the second treatment; and
providing a recommendation, using the graphical user interface, based on the total expected total error result of the second treatment to decrease contamination and increase effective harvesting yield of the field; wherein the recommendation include one or more corrective actions for operations of the agricultural implement or treatment.

16. The data processing system of claim 15, wherein the first agronomic treatment data pertains to a first treatment to the field;
wherein the first agronomic treatment data comprise one or more characteristics of the field which can be modelled in a position and/or vector-based format;
wherein the first treatment comprises a number of seeds planted in the field in a specific pattern;
wherein planting of the number of seeds in the field includes planting, by a farming implement active in the field, in horizontally or vertically aligned rows of agricultural seeds;

wherein every other row of planted seeds contains a same hybrid genus or species of crop.

17. The data processing system of claim 16, wherein the second agronomic treatment data pertain to a second treatment to the field;
   wherein the second agronomic treatment data comprise a pattern of traversal or treatment applied to the field by the farming implement;
   wherein the pattern of traversal or treatment may relate to an orientation of the characteristics of the first treatment;
   wherein the second agronomic treatment data represent positional data of the farming implement traversing the field in horizontal patterns to harvest hybrid crops planted therein during the first treatment;
   wherein the pattern of traversal of the second treatment is further characterized by regular or periodic positions of the farming implement in the field;
   wherein the pattern of traversal is subcategorized according to one or more of: a position of the farming implement, a regular time period of operation of the farming implement, or a shaping of interval polygons generated during field traversal.

18. The data processing system of claim 17, wherein the agricultural intelligence computer system uses the first agronomic treatment data and the second agronomic treatment data to determine differences between one or more locations and one or more orientations of the characteristics and the pattern of traversal of the farming implement.

19. The data processing system of claim 18, wherein the agricultural intelligence computer system determines the differences between one or more locations and one or more orientations of the characteristics based on overall pattern of the traversal of the farming implement.

20. The data processing system of claim 18, wherein the agricultural intelligence computer system determines the difference between one or more locations and one or more orientations of the characteristics based an individual geometric basis for different periods and spatial vectors of travel;
   wherein the agricultural intelligence computer system determines the difference based on a number of one or more vector-based polygons corresponding to periods of traversal of the farming implement;
   wherein a polygon, of the one or more vector-based polygons, is represented by polygon data that convey one or more aspects of a spatial area;
   wherein the one or more aspects of the spatial area includes one or more of: the pattern of traversal, a shape, a work order, treatment or any other data or action performed in the spatial area;
   wherein the polygon, of the one or more vector-based polygons, is an enclosed shape representing a portion of a treatment applied to the field;
   wherein the polygon data is compared to the first agronomic treatment data to determine a degree of overlap between positional characteristics of the first agronomic treatment and an individual polygon.

* * * * *